United States Patent
Sugita et al.

(10) Patent No.: US 6,842,317 B2
(45) Date of Patent: Jan. 11, 2005

(54) MAGNETORESISTIVE ELEMENT, MAGNETIC HEAD, MAGNETIC MEMORY AND MAGNETIC RECORDING APPARATUS USING THE SAME

(75) Inventors: Yasunari Sugita, Osaka (JP); Akihiro Odagawa, Tsuchiura (JP); Nozomu Matsukawa, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/692,362

(22) Filed: Oct. 22, 2003

(65) Prior Publication Data

US 2004/0080876 A1 Apr. 29, 2004

Related U.S. Application Data

(63) Continuation of application No. PCT/JP03/04136, filed on Mar. 31, 2003.

(30) Foreign Application Priority Data

Apr. 22, 2002 (JP) .......................... 2002-119831

(51) Int. Cl.$^7$ ............................ G11B 5/39; H01F 10/14
(52) U.S. Cl. .................... 360/324.2; 365/158; 365/171; 365/173
(58) Field of Search .......................... 360/324.2, 324.1, 360/324.11, 324.12; 365/158, 171, 173

(56) References Cited

U.S. PATENT DOCUMENTS

| | | | |
|---|---|---|---|
| 6,703,249 B2 | * 3/2004 | Okazawa et al. | ............... 438/4 |
| 6,751,055 B1 | * 6/2004 | Alfoqaha et al. | ........... 360/126 |
| 2001/0033464 A1 | 10/2001 | Shimazawa et al. | |
| 2002/0186011 A1 | * 12/2002 | Murata et al. | ............... 324/252 |
| 2003/0235014 A1 | * 12/2003 | Yamanaka et al. | .......... 360/317 |
| 2004/0008451 A1 | * 1/2004 | Zou et al. | .................... 360/317 |

FOREIGN PATENT DOCUMENTS

JP 8-236349 9/1996

OTHER PUBLICATIONS

Matsukawa N. et al., "Thermally stable exchange–biased . . . ", in *Applied Physics Letters*, Dec. 16, 2002, vol. 81, No. 25, pp 4784–4786.

Sugita Y et al., "Thermal stability of PtMn based . . . ", in *Journal of Applied Physics*, Jun. 1, 2001, vol. 89, No. 11, pp. 6919–6921.

Miyazaki T., "Spin Tunnel Junction", in *Materials Integration*, 2000, vol. 13, No. 12 pp 7–12.

Miyazaki T et al., "Giant magnetic tunneling effect . . . ", in *Journal of Magnetism and Magnetic Materials*, 1995, 139, L231–L234.

Julliere M., "Tunneling Between Ferromagnetic Films", in *Physics Letters*, Sep. 8, 1975, vol. 54A, No. 3, pp 225–226.

Miyazaki T. et al., "Spin Polarized Tunneling in . . . " in *Journal of Magnetism and Magnetic Materials*, 1995, 151, pp 403–410.

* cited by examiner

*Primary Examiner*—William Klimowicz
(74) *Attorney, Agent, or Firm*—Merchant & Gould P.C.

(57) ABSTRACT

A magnetoresistive element includes a multilayer film configuration including: a tunnel insulation layer; and a pair of magnetic layers that are laminated with the tunnel insulation layer interposed therebetween. A resistance value of the magnetoresistive element varies with a relative angle between magnetic orientations of both of the magnetic layers, and at least one of the magnetic layers includes a magnetic film having a thermal expansion coefficient not greater than a value obtained by adding $2 \times 10^{-6}$/K to a thermal expansion coefficient of the tunnel insulation layer. The thus configured magnetoresistive element can exert excellent thermal stability. The use of such a magnetoresistive element can realize a magnetic head, a magnetic memory element and a magnetic recording apparatus with excellent thermal stability.

17 Claims, 11 Drawing Sheets

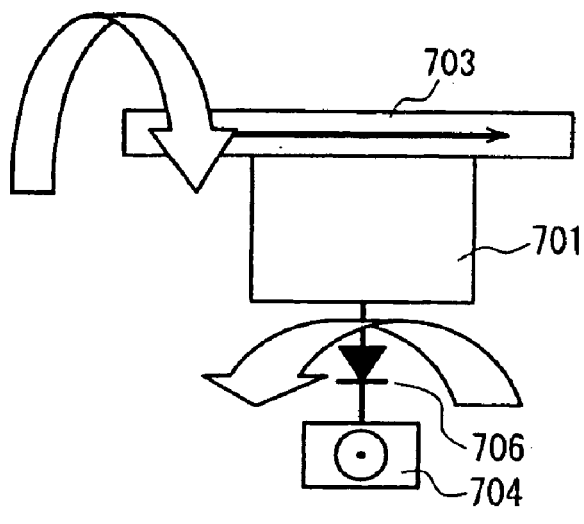
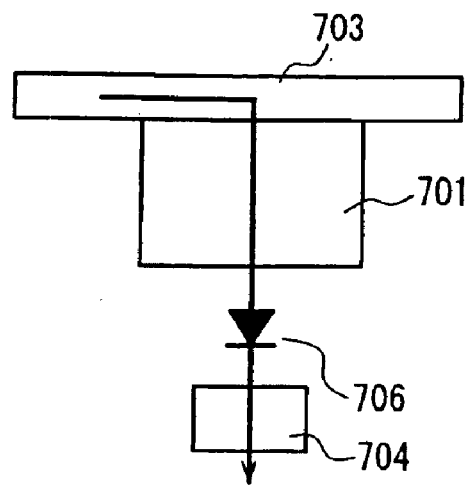
FIG. 16A  FIG. 16B
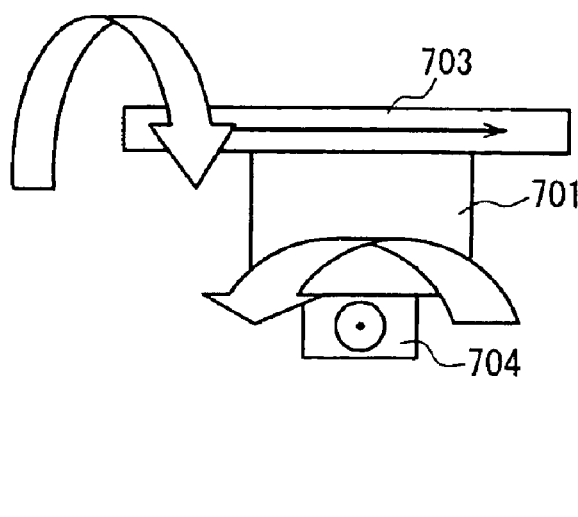
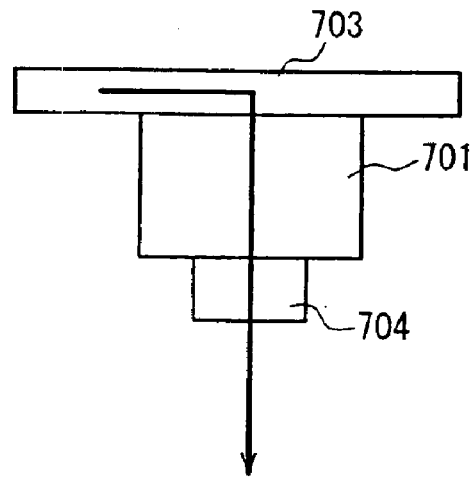
FIG. 17A  FIG. 17B

MAGNETORESISTIVE ELEMENT, MAGNETIC HEAD, MAGNETIC MEMORY AND MAGNETIC RECORDING APPARATUS USING THE SAME

BACKGROUND OF THE INVENTION

1. Field of the Invention

The present invention relates to a magnetoresistive element and relates to a magnetic device such as a magnetic head and a magnetic memory and a magnetic recording apparatus using the same.

2. Related Background Art

In recent years, developments have been carried out vigorously for applying a magnetoresistive effect to a magnetic head, a magnetic memory (Magnetic Random Access Memory (MRAM)) and the like. The MR effect is based on a conductive phenomenon depending on the spin of the electron, in which a resistance value of a multilayer film including a "magnetic layer/non-magnetic layer/magnetic layer" configuration varies with a relative angle between the magnetic orientations of the magnetic layers arranged adjacent to each other with the non-magnetic layer interposed therebetween. In general, when the magnetic orientations are parallel with each other, the resistance value becomes the minimum. Conversely, when the magnetic orientations are anti-parallel to each other, the resistance value becomes the maximum. Elements exploiting such a MR effect are referred to as MR elements. Among MR elements, elements with a non-magnetic layer made of a conductive material such as Cu are referred to as GMR elements, while elements with a non-magnetic layer made of an insulating material such as $Al_2O_3$ are referred to as TMR elements. In the TMR elements, a magnetoresistance change ratio (MR ratio) increases with increasing a spin polarization rate of magnetic layers sandwiching a non-magnetic layer. Currently, this TMR element is expected to be a MR element exerting a large MR ratio.

In order to apply this TMR element to a device such as a magnetic head or a MRAM, there is a need to further enhance and stabilize the output of the element. In addition, the element is required to have thermal stability capable of resisting the manufacturing process of the device. For instance, in the process for manufacturing a magnetic head, heat is applied generally at about 250° C. to 300° C. When the element is mounted in a hard disk drive (HDD), it is required to operate with stability at the operational environmental temperatures (e.g., around 150° C.) for a long time. Furthermore, while studies have been made to produce a MR element on a CMOS for the application as a MRAM device, the process for manufacturing the CMOS requires heat treatment at much higher temperatures (e.g., 400° C. to 450° C.).

However, when the conventional TMR element having a tunnel junction structure between a tunnel insulation layer and a magnetic layer undergoes the heat treatment at 300° or higher, the magnetoresistance properties (MR properties) deteriorate. Particularly, there is a tendency to degrade a MR ratio representing the output of the element. Thus, in order to apply the TMR element to a device such as a magnetic head and a MRAM, it becomes important to develop a TMR element whose MR properties have thermal stability in an increase in temperature of the element caused by the heat treatment and the like.

SUMMARY OF THE INVENTION

Therefore, with the foregoing in mind, it is an object of the present invention to provide a magnetoresistive element having resistance to deterioration of MR properties due to an increase in temperature caused by the heat treatment and the operation of the element, that is, to provide a magnetoresistive element with excellent thermal stability. In addition, it is another object of the present invention to provide a magnetic head and a magnetic memory, and a magnetic recording apparatus with excellent thermal stability.

In order to fulfill the above-stated object, a magnetoresistive element of the present invention includes: a multilayer film configuration including: a tunnel insulation layer; and a pair of magnetic layers that are laminated with the tunnel insulation layer interposed therebetween. A resistance value of the magnetoresistive element varies with a relative angle between magnetic orientations of both of the magnetic layers, and at least one of the magnetic layers includes a magnetic film (hereinafter also referred to as a low thermal expansion magnetic film) having a thermal expansion coefficient not greater than a value obtained by adding $2 \times 10^{-6}/K$ to a thermal expansion coefficient of the tunnel insulation layer. Note here that the thermal expansion coefficient in this specification refers to a linear thermal expansion coefficient at room temperatures and under normal pressure.

For instance, in the conventional MR element using $Al_2O_3$ as a tunnel insulation layer and Co as a magnetic layer, a thermal expansion coefficient of the magnetic layer is larger than a thermal expansion coefficient of the tunnel insulation layer by about $5 \times 10^{-6}/K$. In such a MR element, it can be considered that as a temperature of the element increases, the magnetic layer with a relatively large thermal expansion coefficient increasingly compresses the tunnel insulation layer, thus increasing the stress loading applied to the tunnel insulation layer. When the stress loading applied to the tunnel insulation layer is increased, it becomes difficult for the tunnel insulation layer to maintain its tunnel properties. If the tunnel insulation layer loses the tunnel properties, MR properties of the element will deteriorate.

On the other hand, in the MR element of the present invention, the magnetic layer includes a magnetic film with a thermal expansion coefficient approximately equal to or not greater than the thermal expansion coefficient of the tunnel insulation layer, which can suppress the stress loading applied to the tunnel insulation layer, caused by the thermal expansion of the magnetic layer. Therefore, the tunnel insulation layer can maintain its tunnel properties even at high temperatures, thus suppressing the deterioration of the MR properties of the element. Note here that, even if the thermal expansion coefficient of the low thermal expansion magnetic film is larger than the thermal expansion coefficient of the tunnel insulation layer, the above-stated effects can be expected as long as the difference is not more than $2 \times 10^{-6}/K$.

In addition, an insulating material that is used as the tunnel insulation layer generally is unstable under the compression. Meanwhile, a metal material with excellent extensibility is used mainly for the magnetic layer. Therefore, it is preferable that the thermal expansion coefficient of the low thermal expansion magnetic film is not more than the thermal expansion coefficient of the tunnel insulation layer. In such a case, even in the case where a difference in thermal expansion coefficient is large between the layers, the stress loading generated by the thermal expansion of the tunnel insulation layer itself does not become so large, and therefore it can be considered that the MR properties of the element are unlikely to deteriorate.

That is to say, the thus configured MR element can exert excellent thermal stability. In addition, in the MR element of the present invention, the low thermal expansion magnetic film may be in contact with the tunnel insulation layer or may not be in contact with the same.

Next, a magnetic head of the present invention includes: a magnetoresistive element and a shield for restricting introduction of a magnetic field other than a magnetic field to be detected by the magnetoresistive element into the magnetoresistive element. The magnetoresistive element includes a multilayer film configuration including: a tunnel insulation layer; and a pair of magnetic layers that are laminated with the tunnel insulation layer interposed therebetween. A resistance value of the magnetoresistive element varies with a relative angle between magnetic orientations of both of the magnetic layers, and at least one of the magnetic layers includes a magnetic film having a thermal expansion coefficient not greater than a value obtained by adding $2 \times 10^{-6}$/K to a thermal expansion coefficient of the tunnel insulation layer.

Another magnetic head of the present invention may also include: a magnetoresistive element; and a yoke for introducing a magnetic field to be detected by the magnetoresistive element to the magnetoresistive element. The magnetoresistive element includes a multilayer film configuration including: a tunnel insulation layer; and a pair of magnetic layers that are laminated with the tunnel insulation layer interposed therebetween. A resistance value of the magnetoresistive element varies with a relative angle between magnetic orientations of both of the magnetic layers, and at least one of the magnetic layers includes a magnetic film having a thermal expansion coefficient not greater than a value obtained by adding $2 \times 10^{-6}$/K to a thermal expansion coefficient of the tunnel insulation layer.

The thus configured magnetic heads can exert excellent thermal stability.

Next, a magnetic memory of the present invention includes: a magnetoresistive element; conductive lines for recording information on the magnetoresistive element; and conductive lines for reading out the information. The magnetoresistive element includes a multilayer film configuration including: a tunnel insulation layer; and a pair of magnetic layers that are laminated with the tunnel insulation layer interposed therebetween. A resistance value of the magnetoresistive element varies with a relative angle between magnetic orientations of both of the magnetic layers, and at least one of the magnetic layers includes a magnetic film having a thermal expansion coefficient not greater than a value obtained by adding $2 \times 10^{-6}$/K to a thermal expansion coefficient of the tunnel insulation layer.

The thus configured magnetic memory can provide excellent thermal stability.

Next, a magnetic recording apparatus of the present invention includes: a magnetic head, and a magnetic recording medium from which magnetic information can be read out by the magnetic head. The magnetic head includes: a magnetoresistive element and a shield for restricting introduction of a magnetic field other than a magnetic field to be detected by the magnetoresistive element into the magnetoresistive element. The magnetoresistive element includes a multilayer film configuration including: a tunnel insulation layer; and a pair of magnetic layers that are laminated with the tunnel insulation layer interposed therebetween. A resistance value of the magnetoresistive element varies with a relative angle between magnetic orientations of both of the magnetic layers, and at least one of the magnetic layers includes a magnetic film having a thermal expansion coefficient not greater than a value obtained by adding $2 \times 10^{-6}$/K to a thermal expansion coefficient of the tunnel insulation layer.

Another magnetic recording apparatus of the present invention may include: a magnetic head, and a magnetic recording medium from which magnetic information can be read out by the magnetic head. The magnetic head includes: a magnetoresistive element; and a yoke for introducing magnetic field to be detected by the magnetoresistive element to the magnetoresistive element. The magnetoresistive element includes a multilayer film configuration including: a tunnel insulation layer; and a pair of magnetic layers that are laminated with the tunnel insulation layer interposed therebetween. A resistance value of the magnetoresistive element varies with a relative angle between magnetic orientations of both of the magnetic layers, and at least one of the magnetic layers includes a magnetic film having a thermal expansion coefficient not greater than a value obtained by adding $2 \times 10^{-6}$/K to a thermal expansion coefficient of the tunnel insulation layer.

The thus configured magnetic recording apparatuses can exert excellent thermal stability.

BRIEF DESCRIPTION OF THE DRAWINGS

FIG. 16A and FIG. 16B schematically show a basic example of an operation in the magnetic memory of the present invention.

FIG. 17A and FIG. 17B schematically show a basic example of an operation in the magnetic memory of the present invention.

DETAILED DESCRIPTION OF THE INVENTION

Figure 1:
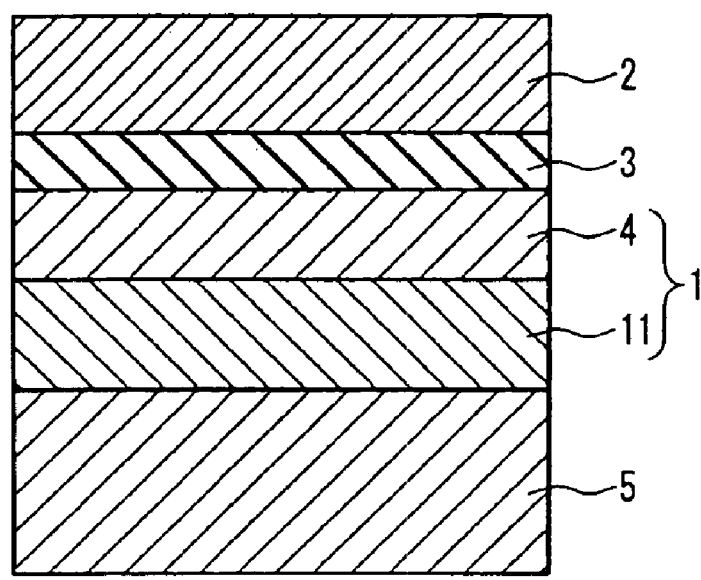
FIG. 1 is cross-sectional view showing one example of a MR element of the present invention.

The following describes embodiments of the present invention, with reference to the drawings. In the following embodiments, the same reference numerals may be assigned to the same elements, and their explanations may be omitted.

Firstly, a MR element of the present invention will be described below.

FIG. 1 is a cross-sectional view showing one example of the MR element of the present invention. The MR element shown in FIG. 1 includes a multilayer film configuration, in which an antiferromagnetic layer 5, a first magnetic layer 1, a tunnel insulation layer 3 and a second magnetic layer 2 are laminated in this stated order. The first magnetic layer 1 includes a magnetic film 11 and a low thermal expansion magnetic film 4.

Figure 2:
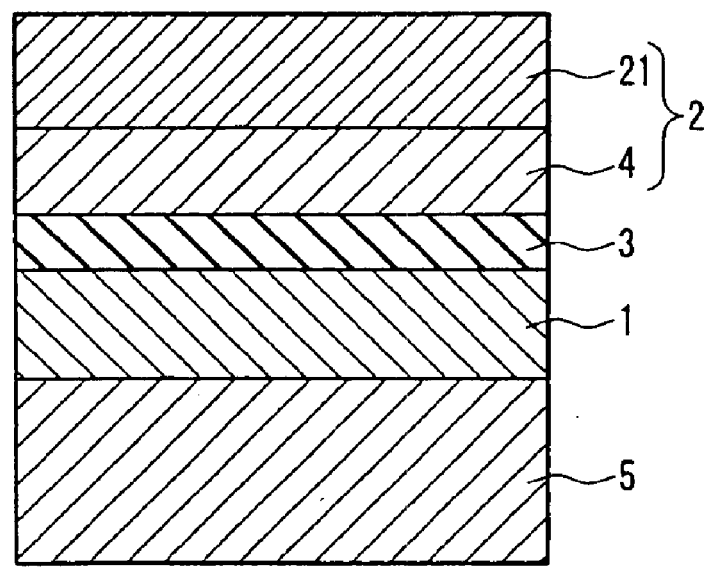
FIG. 2 is a cross-sectional view showing another example of the MR element of the present invention.

FIG. 2 is a cross-sectional view showing another example of the MR element of the present invention. The MR element shown in FIG. 2 includes a multilayer film configuration, in which an antiferromagnetic layer 5, a first magnetic layer 1, a tunnel insulation layer 3 and a second magnetic layer 2 are laminated in this stated order. In the MR element shown in FIG. 2, the second magnetic layer 2 includes a magnetic film 21 and a low thermal expansion magnetic film 4.

Figure 3:
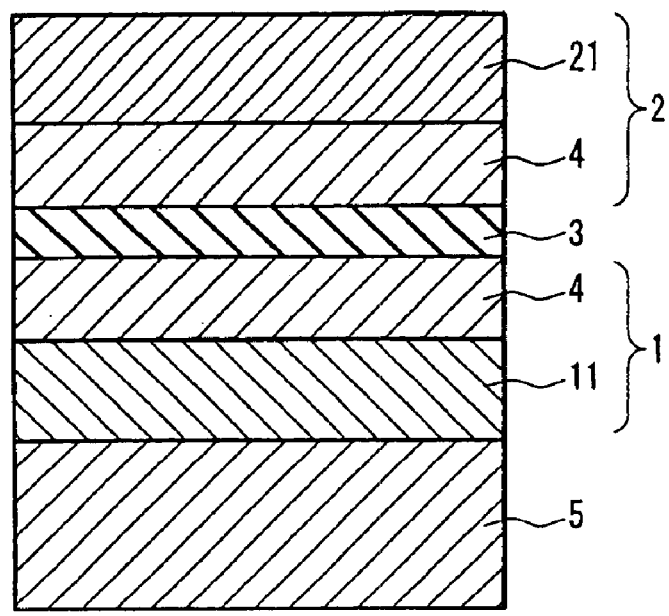
FIG. 3 is a cross-sectional view showing still another example of the MR element of the present invention.

As shown in FIGS. 1 and 2, in the MR element of the present invention, at least one of the first magnetic layer 1 and the second magnetic layer 2 that sandwich the tunnel insulation layer 3 includes the low thermal expansion magnetic film 4. Alternatively, as shown in FIG. 3, each of the first magnetic layer 1 and the second magnetic layer 2 that sandwich the tunnel insulation layer 3 may include the low thermal expansion magnetic film 4. In the MR element shown in FIG. 3, the first magnetic layer 1 includes the low thermal expansion magnetic film 4 and a magnetic film 11 and the second magnetic layer 2 includes a magnetic film 21 and the low thermal expansion magnetic film 4.

With these configurations, a MR element with excellent thermal stability can be obtained.

Note here that, in the MR elements shown in FIGS. 1 to 3, the antiferromagnetic layer 5 is arranged in contact with the first magnetic layer 1, where the first magnetic layer 1 functions as a pinned magnetic layer (a magnetic layer in which the magnetic orientation is fixed by the antiferromagnetic layer 5) and the second magnetic layer 2 functions as a free magnetic layer (a magnetic layer in which the magnetic orientation can rotate easily relative to the first magnetic layer), so as to constitute a spin valve type MR element. Since the spin valve type MR element allows a relative angle between the magnetic orientations of the pinned magnetic layer and the free magnetic layer to be changed more easily, the MR element can be made more suitable for a device operating in the minute magnetic field. Additionally, a smaller MR element with a large MR ratio can be realized. The MR element of the present invention is not limited to such a spin valve type element. The same applies to the following examples.

The low thermal expansion magnetic film may satisfy the relationship represented by the following formula (1):

$$t_1 \leq t_2 + (2 \times 10^{-6}/K) \quad (1)$$

where $t_1$ represents a thermal expansion coefficient of the low thermal expansion magnetic film (1/K), and $t_2$ represents a thermal expansion coefficient of the tunnel insulation layer (1/K).

Among such films, a magnetic film satisfying the relationship of $t_1 = t_2$ (that is, the thermal expansion coefficient of the low thermal expansion magnetic film is equal to the thermal expansion coefficient of the tunnel insulation layer) is preferable, which includes, for example, samples a02 and a04 described later in examples. In addition, a magnetic film satisfying the relationship of $t_1 \leq t_2 - (3 \times 10^{-6}/K)$ is more preferable, which includes, for example, a sample a03 described later in examples. Note here that the lower limit of $t_1$ is not limited especially, which may be not less than $-1 \times 10^{-5}/K$, for example.

As a material for the low thermal expansion magnetic film, for example, an invar alloy and a magnetic material having a composition close to the composition of the invar alloy may be used. As the invar alloy, for example, an alloy having compositions of Fe—Ni, Fe—Pt, Fe—Pd, Fe—Ni—Co, Fe—Ni—Mn, Fe—Ni—Cr, Fe—Ni—V, Fe—Ni—Pt and the like may be used. Note here that the simple notation of the composition of the material as in Fe—Ni is not intended to limit the composition ratio of the constituting elements, which also applies to the other compositions.

Particularly, when an alloy having a composition represented by the formula $Fe_x$—$Ni_y$—$Co_z$ (where $x+y+z=1$, $0.5 \leq x \leq 0.7$, $0.3 \leq y \leq 0.45$, $0 \leq z \leq 0.2$), an alloy having a composition represented by the formula $Fe_{1-a}$—$Pt_a$ (where $0.15 \leq a \leq 0.45$), an alloy having a composition represented by the formula $Fe_{1-b}$—$Pd_b$ (where $0.2 \leq b \leq 0.45$) and the like are used, a MR element with more excellent thermal stability and stable MR properties can be obtained. In addition, it can be expected that the use of the invar alloy as the low thermal expansion magnetic film leads to a larger MR ratio. Note here that all of the figures used in this specification to represent compositions are based on the atomic composition ratio.

Alternatively, as a material for the low thermal expansion magnetic film, for example, an amorphous magnetic material containing Fe as a main component (a Fe-base amorphous alloy) may be used. The "main component" refers to a component of not less than 0.5 represented by the atomic composition ratio. Particularly, a magnetic material having a composition represented by the formula $Fe_{1-c}$—$M_c$ (where $0.05 \leq c \leq 0.3$, and M is at least one element selected from the group consisting of B, P, Si, Zr and Hf) is preferable. Such a magnetic material has a small thermal expansion coefficient and amorphous properties, which suppresses a change in interfacial configuration between the tunnel insulation layer and the magnetic layer due to the heat treatment (e.g., an increase in asperities of the interface) and the diffusion of impurity atoms, thus obtaining a MR element with more excellent thermal stability. In particular, in the spin valve type MR element, there is a risk that the diffusion of the impurity atoms such as Mn atoms contained in the antiferromagnetic layer causes a decrease in spin polarization rate of the magnetic layer, deterioration and breakage in the tunnel insulation layer and the like, which might result in deterioration of MR properties. To avoid this, by suppressing the diffusion of the impurity atoms, a MR element with more excellent thermal stability can be obtained.

Note here that the low thermal expansion magnetic film may contain both of the invar alloy and the Fe-base amorphous alloy.

The thickness of the low thermal expansion magnetic film may range from 0.3 nm to 50 nm, for example, and a range from 0.5 nm to 10 nm is preferable. In addition, the ratio of the low thermal expansion magnetic film to the first magnetic layer and/or the second magnetic layer may range from 10 vol % to 100 vol %.

A material of the tunnel insulation layer is not limited especially, and, for example, the tunnel insulation layer may contain at least one compound selected from the group consisting of an oxide, a nitride and an oxynitride of Al. Such a compound has an excellent insulation property, allows the film to be thinned, and has excellent reproducibility of MR properties. As the oxide and the nitride of Al, for example, $Al_2O_3$, AlN and the like may be used. Note here that the thermal expansion coefficients of $Al_2O_3$ and AlN are $8\times10^{-6}$/K and $4\times10^{-6}$/K, respectively.

The thickness of the tunnel insulation layer may range from 0.4 nm to 5 nm, for example, in order to obtain an effective tunnel current, and a range not more than 3 nm is preferable.

As for the portion in the first magnetic layer and the second magnetic layer except for the low thermal expansion magnetic film (the portions corresponding to the magnetic films 11 and 21 in FIGS. 1 to 3), a material thereof is not limited especially. For example, a magnetic material made of Co, Fe, Ni, Co—Fe, Ni—Fe, Ni—Co—Fe and the like may be used. In addition, if required, a plurality of magnetic films made of different magnetic materials may be laminated.

The thickness of the first magnetic layer and the second magnetic layer, which includes the thickness of the low thermal expansion magnetic film, may range from 1 nm to 10 nm.

In the case of the spin valve type MR element as illustrated in FIGS. 1 to 3, a magnetic material having excellent soft magnetic properties, for example, may be used for the magnetic layer functioning as the free magnetic layer. As the magnetic material with excellent soft magnetic properties, for example, a metal G having a composition represented by the formula $Ni_p$—$Co_q$—$Fe_r$ may be used. In the case where the metal G consists of three components ($p\neq0$, $q\neq0$, $r\neq0$), a range represented by $0.6\leq p\leq0.9$, $0<q\leq0.4$ and $0<r\leq0.3$ or a range represented by $0<p\leq0.4$, $0.2\leq q\leq0.95$ and $0<r\leq0.5$ is preferable. In the case where the metal G consists of two components of Ni and Fe ($p\neq0$, $q=0$, $r\neq0$), a range represented by $0.6\leq p<1$ and $0<r\leq0.4$ is preferable. In the case where the metal G consists of two components of Co and Fe ($p=0$, $q\neq0$, $r\neq0$), a range represented by $0.7\leq q\leq0.95$ and $0.05\leq r\leq0.3$ is preferable. Note here in every case of the above, the relationship of $p+q+r=1$ is satisfied.

Alternatively, an amorphous magnetic material containing a 3d transition metal such as Co—Fe—B, Co—Mn—B and Fe—Co—Si as a main body may be used as the magnetic layer functioning as the free magnetic layer. These magnetic materials also have excellent soft magnetic properties. In addition, if required, the free magnetic layer may be constituted by laminating a plurality of magnetic films made of different magnetic materials.

The magnetic layer functioning as the pinned magnetic layer may include a magnetic film containing a magnetic material having a large magnetic anisotropy or may include a lamination film of these magnetic films. As the magnetic material having a large magnetic anisotropy, for example, Co, a Co—Fe alloy and the like may be used. Alternatively, a high coercive magnetic material having a composition represented by the formula A—D, typified by a Co—Pt alloy and a Fe—Pt alloy (where A is at least one element selected from the group consisting of Fe, Co and Ni, and D is at least one element selected from the group consisting of Pt, Rh, Pd, Ru, Cr, Re, Ir and Ta) may be used. As other materials, an alloy made of a magnetic element and a rare-earth element, typified by a Co—Sm alloy, may be used. Since the spin valve type MR element allows the magnetic orientation of the pinned magnetic layer to be fixed by the antiferromagnetic layer, the above-stated magnetic material having excellent soft magnetic properties may be used as the magnetic layer functioning as the pinned magnetic layer.

A material of the antiferromagnetic layer is not limited especially, and, for example, an antiferromagnetic alloy containing Mn (a Mn based antiferromagnetic alloy) may be used. As the Mn based antiferromagnetic alloy, for example, an alloy having a composition represented by the formula Z—Mn (where Z is at least one element selected from the group consisting of Pt, Ni, Pd, Cr, Rh, Re, Ir, Ru and Fe) may be used. Particularly, alloys having the compositions of Pt—Mn, Pd—Mn, Pd—Pt—Mn, Ni—Mn, Ir—Mn, Cr—Pt—Mn, Ru—Rh—Mn, Fe—Mn and the like are preferable. The exchange coupling energy acting between such a Mn based antiferromagnetic alloy and the magnetic layer is larger than the case where other antiferromagnetic materials (e.g., NiO, CrAl and $\alpha$-$Fe_2O_3$) are used. Therefore, in the case where the Mn based antiferromagnetic alloy is used as the antiferromagnetic layer, a MR element with a reduced influence of the fluctuation due to an external magnetic field and with more stable output can be obtained.

The thickness of the antiferromagnetic layer may range from 5 nm to 30 nm, for example.

Note here that a film made of Ta, Nb, Zr, Pt, Cr and the like may be laminated as a buffer layer of the antiferromagnetic layer. As the buffer layer, a Ni—Fe alloy, an alloy having a composition represented by the formula Ni—Fe—E (where E is at least one element selected from the group consisting of Cr, V, Nb, Pt, Pd, Rh, Ru, Ir Cu and Au) and the like may be used. In this case, the crystal orientation of the antiferromagnetic layer can be controlled, so that a MR element with more stable output and a larger MR ratio can be obtained. The thickness of the buffer layer may range from 1 nm to 10 nm, for example.

In addition, a high spin polarization rate layer containing a magnetic material with a large spin polarization rate may be inserted at an interface between the tunnel insulation layer and at least one magnetic layer selected from the first magnetic layer and the second magnetic layer, which allows a MR element with an increased MR ratio to be obtained.

As the magnetic material with a large spin polarization rate, for example, a semi metal material such as $Fe_3O_4$, $CrO_2$, LaSrMnO and LaCaSrMnO or a Heusler alloy such as NiMnSb and PtMnSb may be used.

The thickness of the high spin polarization rate layer may range from 0.5 nm to 10 nm, for example, and a range not more than 5 nm is preferable. As the high spin polarization rate layer, a single layer film or a lamination film of the magnetic material with a large spin polarization rate may be used.

Conventionally, deterioration of the element properties such as a MR ratio is observed after a heat treatment at high temperatures and a heat cycle repeated many times. As one of the causes of such deterioration, as previously described, an increase in stress loading applied to the tunnel insulation layer can be considered. When the stress loading increases against the tunnel insulation layer, an interface between the respective layers constituting the element, especially an interface between the tunnel insulation layer and the abutting layer thereof, are disturbed, which might cause the generation of asperities.

As another cause of the deterioration of the MR properties due to the heat treatment and the like, the damage to the tunnel insulation layer, the deterioration of magnetic properties of the magnetic layer adjacent to the tunnel insulation layer and the like caused by the diffusion of impurity atoms into the vicinity of the interface of the tunnel insulation layer can be considered. In general, the impurity atoms diffuse through the grain boundary of the respective layers constituting the element. When the temperature of the element increases, the grain boundary of the respective layers is expanded because of the thermal expansion thereof, so that the diffusion speed of the impurity atoms is increased, which might lead to a tendency to the deterioration of the MR properties. Particularly, in the case of a spin valve type MR element including an antiferromagnetic layer made of a Mn based antiferromagnetic alloy such as Pt—Mn and Ir—Mn, the diffusion of Mn caused by the heat treatment might be a cause of the deterioration of the MR properties.

On the other hand, in the MR element of the present invention, the magnetic layer adjacent to the tunnel insulation layer includes the low thermal expansion magnetic film, and therefore an increase in stress loading applied to the tunnel insulation layer is suppressed, whereby the MR element with excellent thermal stability can be obtained. In addition, since the low thermal expansion magnetic film has a small thermal expansion coefficient, which means that the expansion of the grain boundary of the low thermal expansion magnetic film is small at high temperatures, the thermal diffusion of the impurity atoms into the vicinity of the interface of the tunnel insulation layer is suppressed, whereby the MR element with excellent thermal stability can be obtained.

Figure 4:
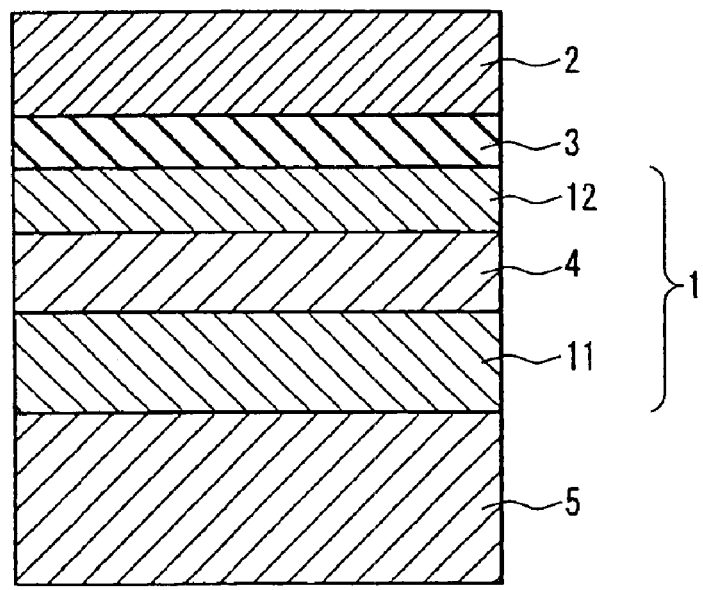
FIG. 4 is a cross-sectional view showing a further example of the MR element of the present invention.

FIG. 4 shows still another example of the MR element of the present invention. In the MR element shown in FIG. 4, a first magnetic layer 1 includes a low thermal expansion magnetic film 4. The low thermal expansion magnetic film 4 is arranged away from an interface between a tunnel insulation layer 3 and the first magnetic layer 1. In this way, even in the case where the low thermal expansion magnetic film 4 and the tunnel insulation layer 3 are not in contact with each other, a MR element with excellent thermal stability can be obtained. That is to say, the present invention is not limited to the case where the low thermal expansion magnetic film 4 and the tunnel insulation layer 3 are in contact with each other. Note here that the MR element shown in FIG. 4 is obtained by further arranging a magnetic film 12 between the low thermal expansion magnetic film 4 and the tunnel insulation layer 3 of the MR element shown in FIG. 1.

In such a MR element, when the magnetic film 12 has a spin polarization rate larger than that of the low thermal expansion magnetic film 4, for example, a large MR ratio can be obtained as compared with the case where the low thermal expansion magnetic film and the tunnel insulation layer 3 are in direct contact with each other. However, when a thermal expansion coefficient of the magnetic film 12 is larger than a thermal expansion coefficient of the tunnel insulation layer 3, a distance between the tunnel insulation layer 3 and the low thermal expansion magnetic film 4 preferably is in a range not more than 2 nm in order to obtain a MR element with excellent thermal stability, and a range not less than 1 nm is more preferable.

Figure 5:
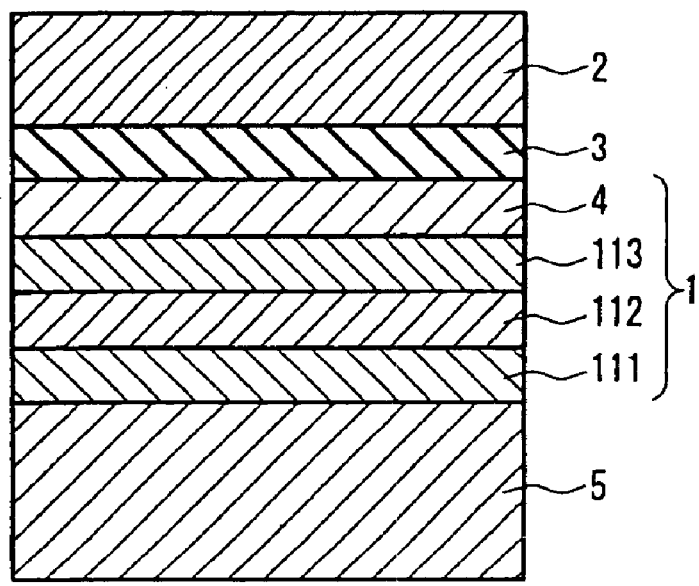
FIG. 5 is a cross-sectional view showing a still further example of the MR element of the present invention.

In the case of a spin valve type MR element, a pinned magnetic layer may include a synthetic ferrimagnetic structure. FIG. 5 shows an example of such a MR element. In the MR element shown in FIG. 5, a first magnetic layer 1 functioning as a pinned magnetic layer includes a synthetic ferrimagnetic structure consisting of a magnetic film 111, a non-magnetic film 112 and a magnetic film 113. Note here that the MR element shown in FIG. 5 is obtained by substituting the magnetic film 11 of the MR element of FIG. 1 with the synthetic ferrimagnetic structure.

The following describes the synthetic ferrimagnetic structure. The synthetic ferrimagnetic structure, as shown in FIG. 5, refers to the structure including a lamination of a pair of magnetic films 111 and 113 with the non-magnetic film 112 interposed therebetween, where the magnetic film 111 and the magnetic film 113 are in an exchange coupling state in an antiferromagnetic manner (the state in which the magnetic orientations are in an anti-parallel state to each other). The inclusion of the synthetic ferrimagnetic structure allows the reversing magnetic field of the magnetization of the first magnetic layer 1 to be increased further, and therefore a larger external magnetic field is required so as to change the magnetic orientation of the first magnetic layer 1. Therefore, it becomes possible to make the thickness of the first magnetic layer 1 thinner, whereby the MR element can be miniaturized further. At the same time, a leakage magnetic field from the first magnetic layer 1 can be made smaller than the case without the synthetic ferrimagnetic structure in the first magnetic layer 1. Therefore, asymmetry of the output of the element due to the leakage magnetic field from the first magnetic layer 1 to the second magnetic layer 2 functioning as a free magnetic layer, which presents a problem in a miniaturized element, can be reduced.

The non-magnetic film included in the synthetic ferrimagnetic structure may be a film containing at least one element selected from the group consisting of Ru, Ir, Rh, Re and Cr, for example. The thickness of the non-magnetic film, for example, may range from 0.4 nm to 1.5 nm. In addition, a plurality of non-magnetic films may be present as long as magnetic films are in contact with both surfaces of the non-magnetic films.

The magnetic film included in the synthetic ferrimagnetic structure may be a film containing Fe, Co and Ni, for example. The thickness of the magnetic film may range from 1 nm to 10 nm, for example.

Figure 6:
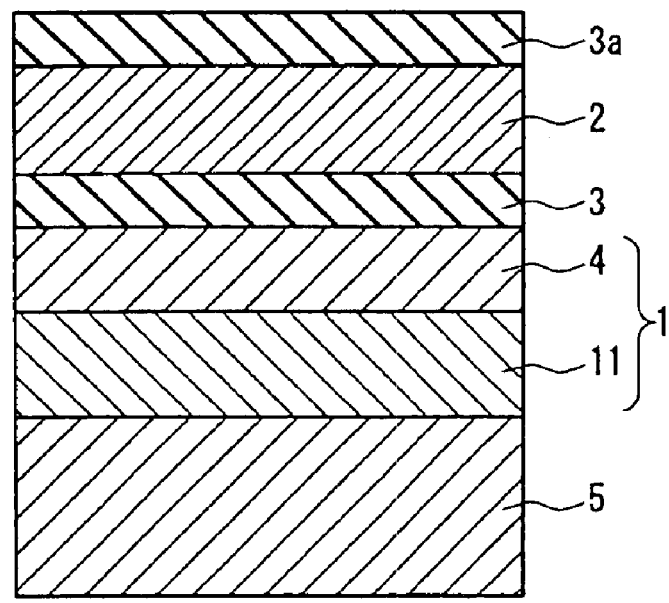
FIG. 6 is a cross-sectional view showing another example of the MR element of the present invention.
Figure 7:
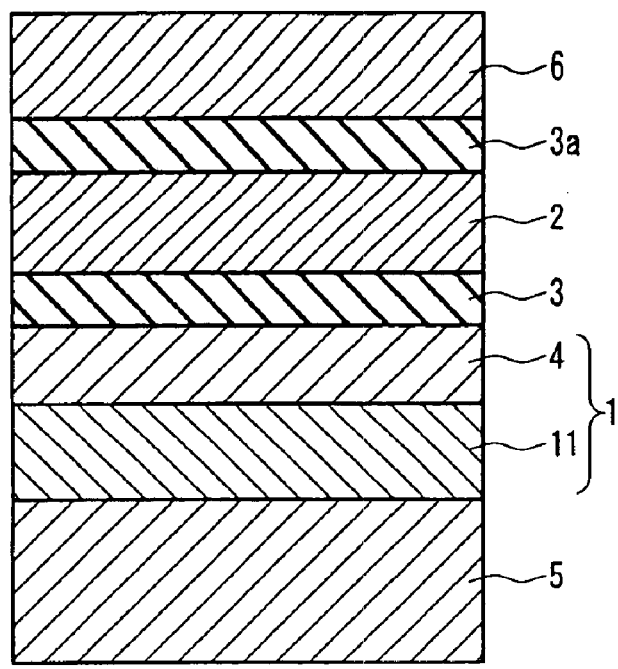
FIG. 7 is a cross-sectional view showing still another example of the MR element of the present invention.
Figure 8:
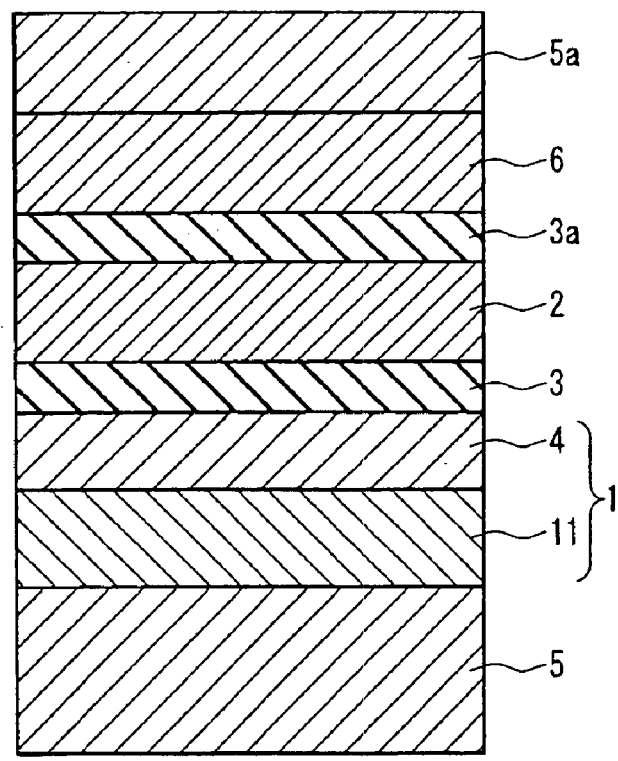
FIG. 8 is a cross-sectional view showing a further example of the MR element of the present invention.

In the MR element of the present invention, a plurality of tunnel insulation layers may be arranged. For example, as shown in FIG. 6, a tunnel insulation layer 3a may be laminated further on the second magnetic layer 2 of the MR element shown in FIG. 1. Additionally, as shown in FIG. 7, a magnetic layer 6 may be laminated further on the tunnel insulation layer 3a of the MR element shown in FIG. 6. Furthermore, as shown in FIG. 8, an antiferromagnetic layer 5a and a magnetic layer 6 may be laminated further on the magnetic layer 6 of the MR element shown in FIG. 7.

In this way, by configuring the MR element so as to include a plurality of tunnel insulation layers, a larger MR ratio can be obtained or a decrease in MR ratio due to an increase in voltage applied thereto can be suppressed. In addition, by making at least one of the plurality of tunnel insulation layers adjacent to the magnetic layer including the low thermal expansion magnetic film, a MR element with excellent thermal stability and favorable MR properties can be obtained.

The following describes a method for producing the MR element of the present invention.

The respective thin films constituting the MR element may be formed by various sputtering methods such as pulse laser deposition (PLD), ion beam deposition (IBD), cluster ion beam, RF, DC, electron cyclotron resonance (ECR), helicon, inductively coupled plasma (ICP), opposed target, a molecular beam epitaxy method (MBE), an ion plating method and the like. In addition to these PVD methods, a CVD method, a plating method, a sol-gel method or the like may be employed.

For example, the tunnel insulation layer made of $Al_2O_3$, AlN and the like may be formed as follows: firstly, a thin film precursor of Al is formed. Next, in an atmosphere containing O or N as the form of molecules, ions, plasma, radical and the like, O or N is allowed to react with the above thin film precursor while controlling the temperature and the time. As a result, the thin film precursor is oxidized or nitrided almost completely so as to obtain the tunnel insulation layer. Alternatively, as the thin film precursor, a non-stoichiometric compound is produced so that O or N is contained at a ratio of a stoichiometric ratio or less.

More specifically, in order to produce a tunnel insulation layer made of $Al_2O_3$ by the sputtering method, a process, in which a thin film precursor made of Al or $AlO_x$ (where $x \leq 1.5$) is deposited in an atmosphere of Ar or $Ar+O_2$, which is oxidized in an $O_2$ gas or an $O_2$+inert gas, may be repeated. Note here that plasma and radical may be generated by a general method such as ECR discharge, glow discharge, RF discharge, helicon and inductively coupled plasma (ICP).

The following describes a device utilizing the MR element of the present invention.

In order to produce a magnetic device including the MR element so as to allow current to flow in a direction perpendicular to the film plane of the element, microprocessing may be performed by combining general methods used in a semiconductor process and a process for producing a GMR head. More specifically, a physical or chemical etching method such as ion milling, reactive ion etching (RIE) and FIB (Focused Ion Beam) and photolithography technology using a stepper and an electron beam (EB) method for forming a fine pattern may be combined.

Figure 9:
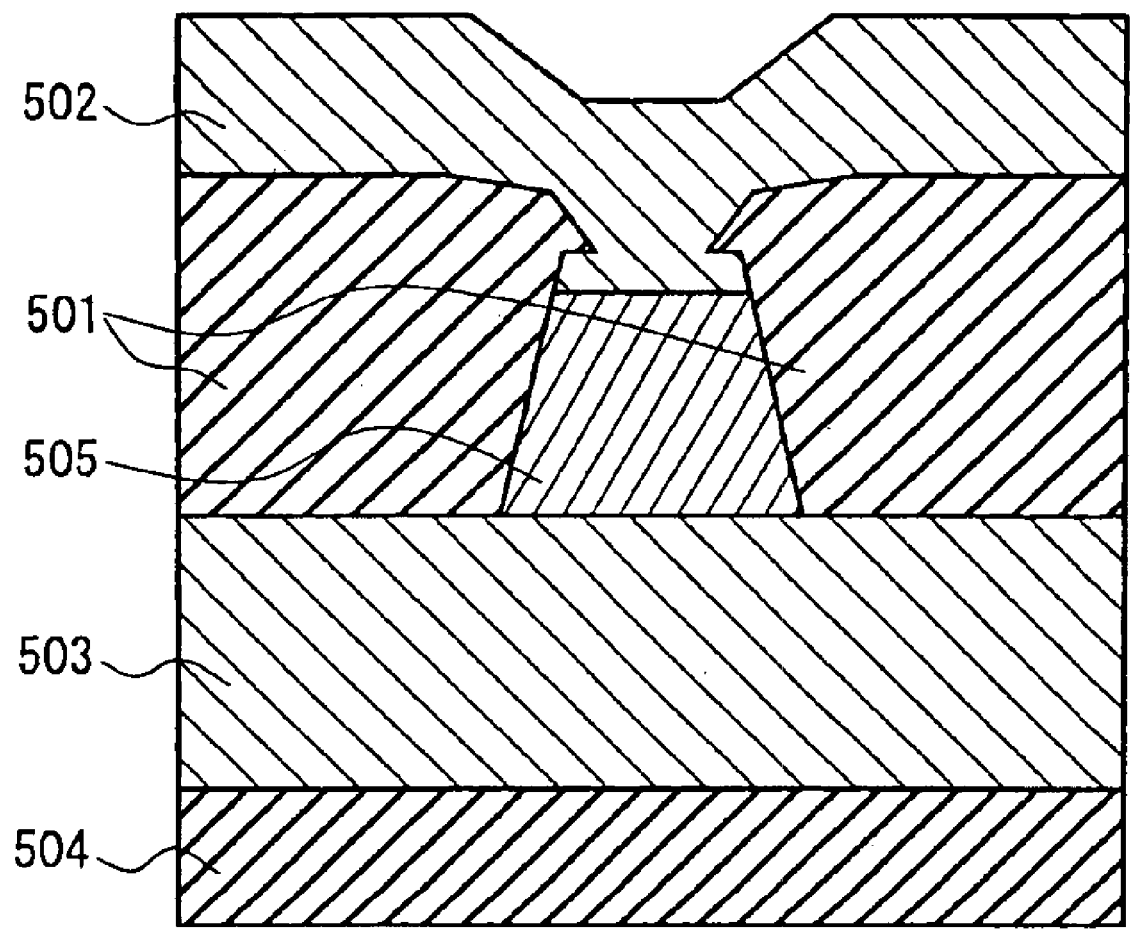
FIG. 9 is a cross-sectional view showing one example of the MR element of the present invention, which further is provided with electrodes.

FIG. 9 shows one example of the MR element produced by such a method, which further is provided with electrodes. In the MR element shown in FIG. 9, a lower electrode 503, a MR element 505 and an upper electrode 502 are laminated on a substrate 504 in this stated order. In addition, at a portion surrounding the MR element 505 and between the upper electrode 502 and the lower electrode 503, an interlayer insulation film 501 is arranged. The interlayer insulation film 501 has a function of preventing an electrical short between the upper electrode 502 and the lower electrode 503. In addition, according to the element shown in FIG. 9, voltage can be measured by applying current to the MR element 505 sandwiched between the upper electrode 502 and the lower electrode 503. Therefore, the configuration of the element as shown in FIG. 9 allows the output therefrom to be read out by applying current in the direction perpendicular to the film plane of the MR element 505. Note here that CMP, cluster ion beam etching and the like may be used in order to planarize the surface of the electrode and the like.

As a material of the upper electrode 502 and the lower electrode 503, for example, a material with low resistance (e.g., linear resistivity not more than 100 $\mu\Omega$cm) such as Pt, Au, Cu, Ru, Al and TiN may be used. As the interlayer insulation film 501, for example, a material with excellent insulation properties such as $Al_2O_3$ and $SiO_2$ may be used.

Figure 10:
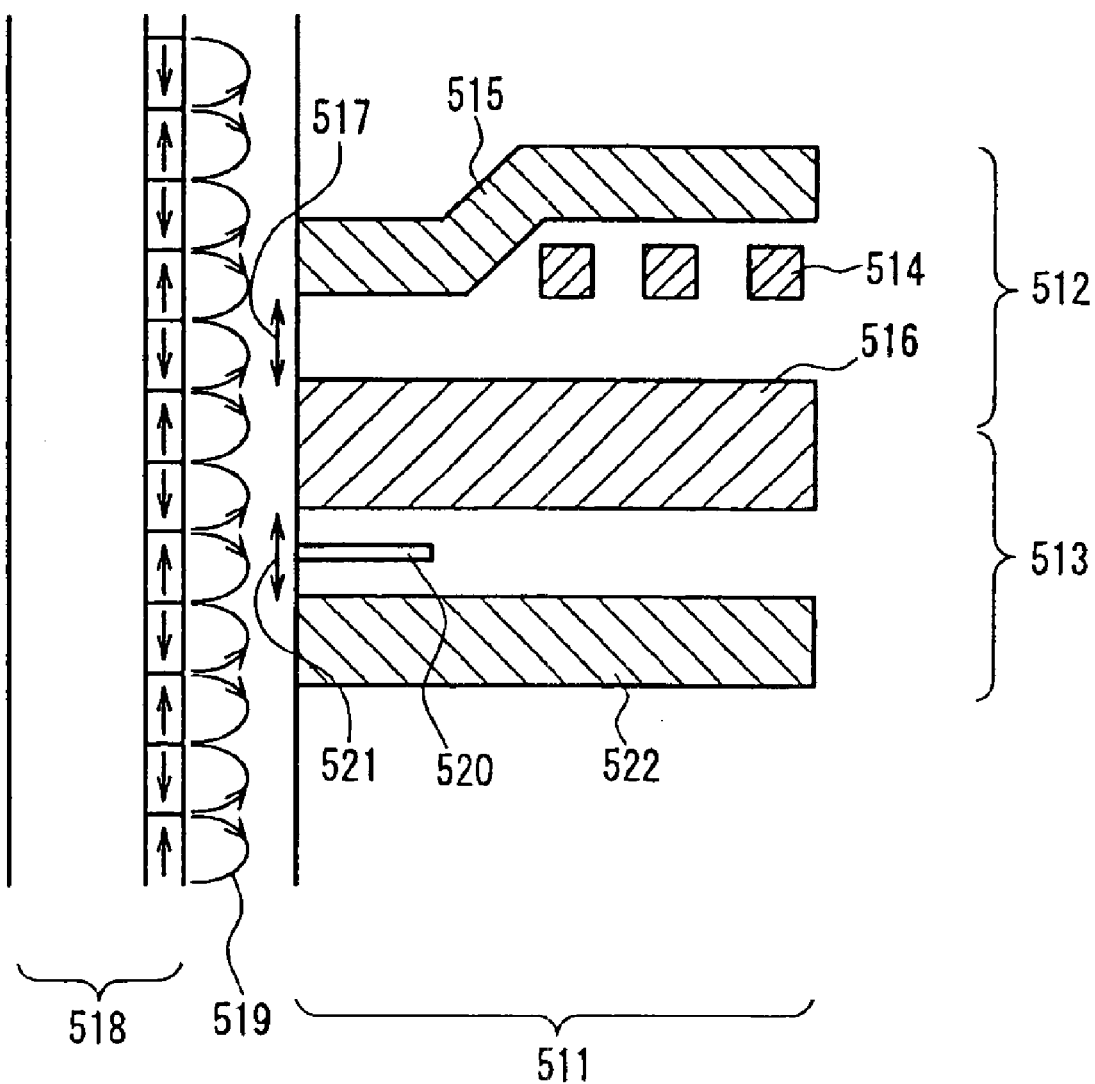
FIG. 10 schematically shows one example of a magnetic head and one example of a recording/reading method of the present invention.

FIG. 10 shows one example of a magnetic head utilizing the MR element of the present invention. FIG. 10 schematically shows a shield type magnetic head provided with a shield for restricting introduction of a magnetic field other than the magnetic field to be detected by the MR element into the MR element, and a recording/reading method by the same. Note here, in FIG. 10, a cross-section of a head unit 511 is shown for the sake of clarity.

The head unit 511 of the magnetic head shown in FIG. 10 is provided with a writing head unit 512 for recording and a read head unit 513 for reading. When information is recorded, current corresponding to the information to be recorded may be applied to a coil 514. Magnetic flux occurring corresponding to the current applied to the coil 514 leaks through a recording gap 517 provided between an upper recording core 515 and an upper shield 516, whereby recording is accomplished on a magnetic recording medium 518.

Meanwhile, information is read out by the action of magnetic flux 519, which corresponds to the information recorded on the magnetic recording medium 518, on a MR element 520 via a read gap 521 provided between the upper shield 516 and a lower shield 522. A resistance value of the MR element 520 varies with the action of the magnetic flux 519, so that the change may be detected.

In this process, the upper shield 516 and the lower shield 522 in the magnetic head shown in FIG. 10 function so as to impose the limitation on the magnetic field other than the magnetic field to be detected (i.e., the magnetic flux 519) by the MR element, whereby a highly sensitive magnetic head can be obtained. In addition, the inclusion of the MR element of the present invention as the MR element 520 can provide a magnetic head with excellent thermal stability.

As a material of the upper shield 516 and the lower shield 522, for example, a soft magnetic material such as Ni—Fe, Fe—Al—Si and Co—Nb—Zr alloys may be used.

Figure 11:
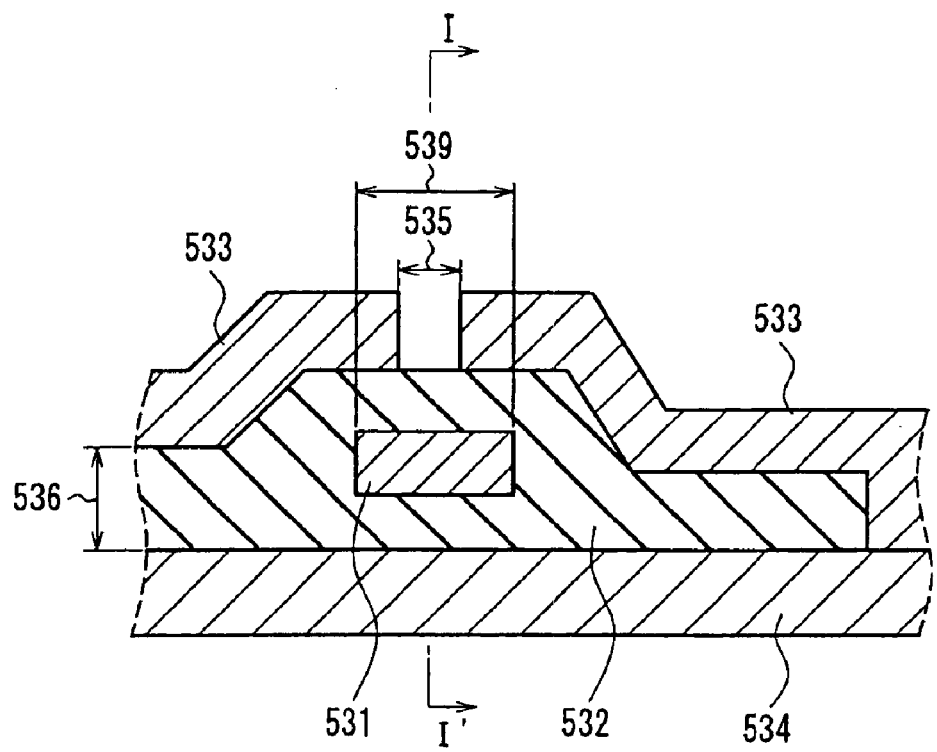
FIG. 11 is a cross-sectional view showing one example of magnetic head of the present invention.

FIG. 11 shows another example of the magnetic head utilizing the MR element of the present invention. The magnetic head shown in FIG. 11 is provided with a yoke for introducing (guiding) the magnetic field to be detected by the MR element to the MR element 531, where the yoke includes an upper yoke 533 and a lower yoke 534. In addition, between the upper yoke 533 and the lower yoke 534, an insulation layer portion 532 is arranged. The upper yoke 533 has a gap 535, and therefore signal magnetic field corresponding to the information recorded on a recording medium is introduced to the MR element 531 via the upper yoke 533. The MR element 531 is arranged between the gap 535 and the lower yoke 534 in such a manner that the MR element 531, the upper yoke 533 and the lower yoke 534 are connected magnetically.

In the magnetic head shown in FIG. 11, the upper yoke 533, the MR element 531 and the lower yoke 534 make up a magnetic circuit. Therefore, the MR element 531 can detect, as an electric signal, the signal magnetic field of the recording medium that is detected by a read gap 536. In addition, the inclusion of the above-described MR element of the present invention as the MR element can provide a magnetic head with excellent thermal stability. Note here that a length of the read gap 536 (read gap length) is in a range not more than 0.2 $\mu$m, for example.

Figure 12:
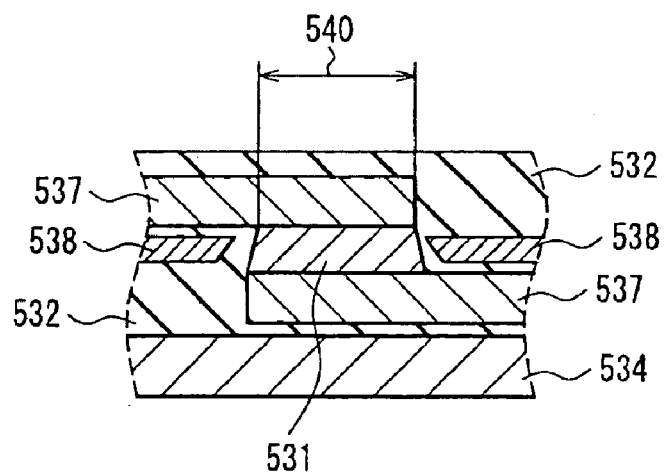
FIG. 12 is a cross-sectional view showing one example of the configuration of the magnetic head shown in FIG. 11.

Now, the configuration of the periphery of the MR element 531 of the magnetic head shown in FIG. 11 is described below. FIG. 12 is a cross-sectional view of a portion of the magnetic head of FIG. 11 that includes the MR element 531, taken along the line I–I'. Note here that the configuration of the periphery of the MR element 531 of the magnetic head shown in FIG. 12 is not a limited one but just one example.

As shown in FIG. 12, on the periphery of the MR element 531, a lead portion 537 for allowing current to flow in the direction perpendicular to the film plane of the MR element 531 and a hard bias portion 538 for controlling the magnetic orientation of a free magnetic layer of the MR element 531 are arranged. In the example shown in FIG. 12, the lead portion 537 and the yoke are isolated electrically from each other by means of the insulation layer portion 532. However, the lead portion 537 and the yoke may be connected electrically with each other. In such a case, the yoke doubles as the lead portion. In addition, in order to allow tunnel current to flow through the MR element 531 with stability, it is preferable that the hard bias portion 538 and the MR element 531 are isolated electrically from each other.

As a material of the insulation layer portion 532, for example, $Al_2O_3$, AlN, $SiO_2$ and the like may be used. As a material of the upper yoke 533 and the lower yoke 534, a general soft magnetic material such as Fe—Si—Al, Ni—Fe, Ni—Fe—Co, Co—Nb—Zr, Co—Ta—Zr and Fe—Ta—N may be used. Also, a lamination film including a film made of these soft magnetic materials and a non-magnetic film made of Ta, Ru, Cu or the like may be used. As a material of the hard bias portion 538, for example, a Co—Pt alloy and the like may be used. As a material of the lead portion 537, Cu, Au, Pt and the like, which generally exhibit low electric resistance, may be used. Note here that, as for the lower yoke 534, a substrate made of a magnetic material (e.g., a Mn—Zn ferrite substrate) may be used.

In the case of the magnetic head provided with the yoke as shown in FIG. 11, it is preferable that a free magnetic layer of the MR element 531 is arranged on a side of the upper yoke 533.

Generally, the yoke type magnetic head as shown in FIG. 11 is inferior in sensitivity to the shield type magnetic head as shown in FIG. 10. However, the yoke type magnetic head is advantageous for narrowing a gap, because there is no need to arrange a MR element in the shielding gap. In addition, the MR element is not exposed to the recording medium, and therefore damage and wearing due to the contact of the magnetic head with the recording medium is reduced, thus providing excellent reliability. For that reason, the yoke type magnetic head can exert excellent properties when it is applied to a streamer provided with a magnetic tape as a recording medium.

Figure 13:
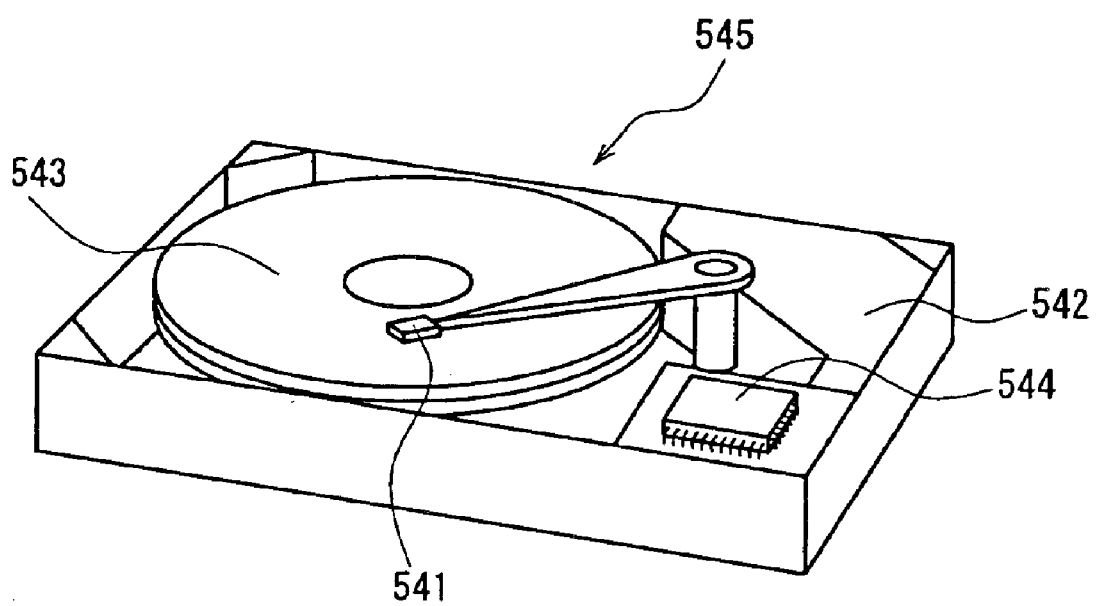
FIG. 13 schematically shows one example of a magnetic recording apparatus of the present invention.

The above-described magnetic head of the present invention can be applied so as to make up a magnetic recording apparatus such as a HDD. FIG. 13 shows one example of a magnetic recording apparatus of the present invention. A magnetic recording apparatus 545 shown in FIG. 13 is provided with a magnetic head 541, a driving unit 542, a magnetic recording medium 543 on which information is recorded, and a signal processing unit 544. In this apparatus, by using the above-described magnetic head of the present invention as the magnetic head 541, a magnetic recording apparatus with excellent thermal stability can be obtained.

Figure 14:
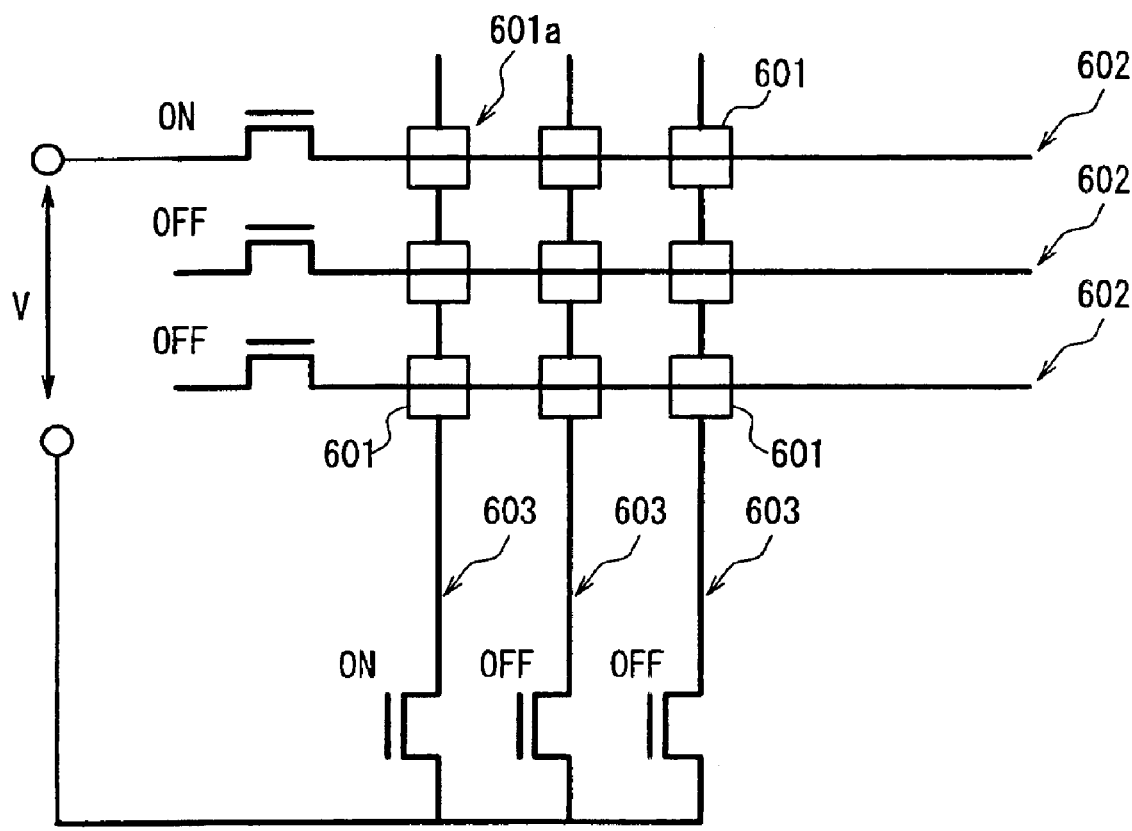
FIG. 14 schematically shows one example of a magnetic memory of the present invention.

FIG. 14 shows one example of a magnetic memory (MRAM) that employs the MR element of the present invention as a memory element. In the MRAM shown in FIG. 14, MR elements 601 are arranged in a matrix form at points of intersection of bit (sense) lines 602 and word lines 603, which are made of Cu, Al and the like. The bit line and the word line correspond to a conductive line for reading information and a conductive line for recording information, respectively. A signal is recorded on the MR element 601 by the combined magnetic field occurring when signal current is applied to these lines. The signal is recorded on an element (in FIG. 14, the MR element 601a) that is arranged at a position where lines turned "ON" intersect with each other (2-current coincident scheme).

Figures 15A, 15B:
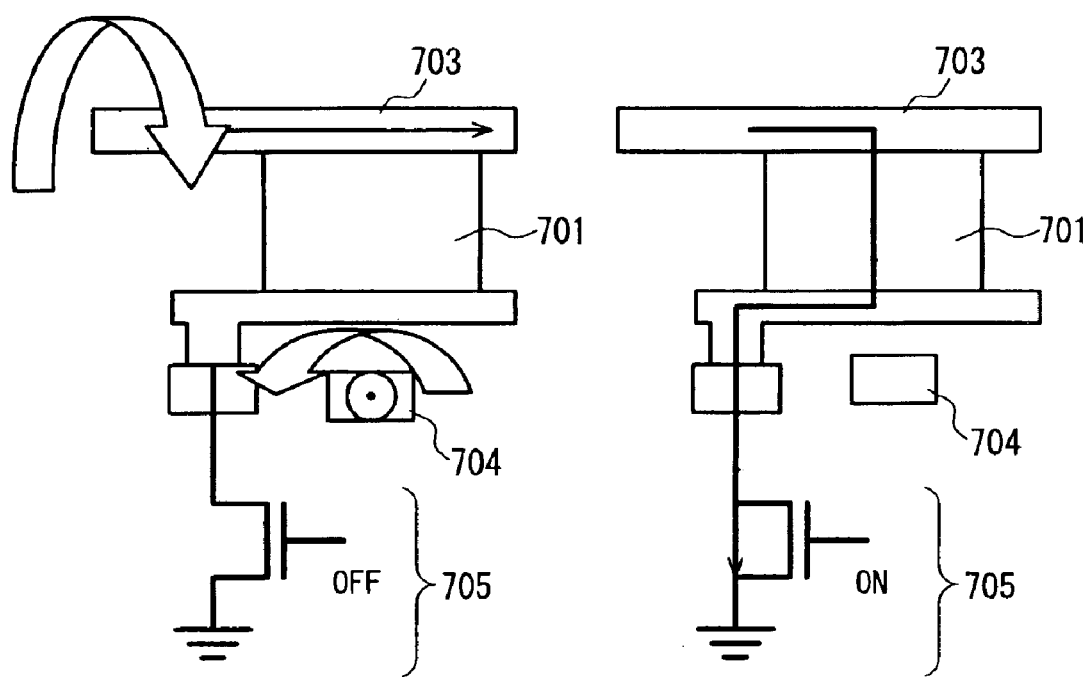
FIG. 15A and FIG. 15B schematically show a basic example of an operation in the magnetic memory of the present invention.

Referring now to FIGS. 15 to 17, the operation of the MRAM will be further described below. FIG. 15A, FIG. 16A and FIG. 17A show basic examples of a writing operation. FIG. 15B, FIG. 16B and FIG. 17B show basic examples of a reading operation. The MR element 701 is the MR element of the present invention as described above.

In the MRAM indicated by FIG. 15A and FIG. 15B, a switching element 705 such as a FET is arranged for each element so as to allow the magnetization state of the MR element 701 to be read out individually. This MRAM is suitable for fabrication on a CMOS substrate. In the MRAM indicated by FIG. 16A and FIG. 16B, a nonlinear element 706 is arranged for each element. As the nonlinear element 706, for example, a varistor, a tunnel element and the above-stated three-terminal element may be used. A rectifying element may be used instead of the nonlinear element. This MRAM can be produced also on a not-expensive glass substrate by the film formation process for a diode. In the MRAM indicated by FIG. 17A and FIG. 17B, a MR element 701 is arranged directly at a point of intersection of a word line 704 and a bit line 703 without the switching element and the nonlinear element as shown in FIGS. 15 and 16. As for this MRAM, current flows through a plurality of elements during the reading-out, and therefore, in terms of the accuracy of the reading-out, the number of elements preferably is limited to not more than 10,000, for example.

In addition, in the MRAM shown in FIGS. 15 to 17, the bit line 703 is used so as to double as a sense line for sensing a change in resistance when current is applied to the element. However, for the purpose of avoiding a malfunction or a breakage of the element due to the bit current, sense lines and bit lines may be arranged separately. In this case, the bit lines preferably are arranged parallel to the sense lines while keeping the electrical insulation from the elements. Note here that, in terms of power consumption during the writing, a space among the word line, the bit line and the MR element may be 500 nm or less, for example.

EXAMPLES

The present invention will be illustrated further in detail with reference to the following non-limiting examples.

On Si substrates (3 inch$\phi$) with a thermal oxide film, MR elements with film configurations described in the following examples were produced by the magnetron sputtering method, and their MR properties were evaluated.

Example 1

Si substrate with a thermal oxide film/Ta (3)/Cu (50)/Ta (3)/Pt—Mn (30)/Co—Fe (1)/X/$Al_2O_3$ (0.6)/$Ni_{0.8}Fe_{0.2}$ (5)

The figure in parentheses represents the thickness of each layer in nm, and the film thickness is expressed in the same manner in the following. However, the figure for $Al_2O_3$ is a designed thickness (total value) for Al prior to the oxidation procedure (the same applies to the following, including a nitride procedure for AlN). $Al_2O_3$ was produced by forming an Al film with a thickness of 0.3 to 0.7 nm, followed by repeated oxidation for 1 minute in an atmosphere containing oxygen at 26.3 kPa (200 Torr).

Ta (3)/Cu (50) on the substrate serves as a lower electrode, and Ta (3) between the lower electrode and the Pt—Mn layer serves as a buffer layer. The Pt—Mn layer is an antiferromagnetic layer, and the MR element of this example is a spin valve type MR element. Note here that the compositions of the Pt—Mn layer and the Co—Fe layer are $Pt_{0.48}Mn_{0.52}$ and $Co_{0.75}Fe_{0.25}$, respectively.

X denotes a magnetic material having the composition shown in the following Table 1. In this example, two types of samples were prepared as conventional examples (sample a01 and sample a08), whereas six types of samples were prepared for this example (samples a02 to a07).

As for the respective samples, films were formed by evacuating a chamber so that a pressure thereof reaches $1.3 \times 10^{-6}$ Pa ($1 \times 10^{-8}$ Torr) or less, followed by the adjustment of the chamber so as to have an atmosphere of Ar gas at about 0.1 Pa (about 0.8 mTorr). During the film formation, a magnetic field ($8.0 \times 10^3$ A/m (100 Oe)) was applied along a direction parallel to a film plane of the samples. Thereafter, the respective samples were subjected to microprocessing into a mesa shape as shown in FIG. 9 by the photolithography method. Then, insulation was applied to the periphery using $Al_2O_3$ as an interlayer insulation film, a through hole was made at the top thereof, and an upper electrode made of Cu (50)/Ta (3) was formed thereon so as to produce a MR element. The size of all the elements was 1 $\mu$m$\times$2 $\mu$m. The thus produced MR elements were allowed to stand for 1 hour in a vacuum and magnetic field at 280° C. and of $4.0 \times 10^5$ A/m (5 kOe) so as to assign magnetic anisotropy to the Pt—Mn layer.

A heat treatment was applied to the thus prepared samples, and thereafter a change in MR properties depending on the temperature of the heat treatment (the dependency of MR properties on the heat treatment temperature) was evaluated. The method for the heat treatment and the method for measuring the MR properties will be given below.

Firstly, in a vacuum and non-magnetic field, the samples were heated up to the respective heat treatment temperatures shown in Table 1, which was held for 30 minutes. Thereafter, the samples were cooled down to room temperatures so as to complete the heat treatment. After the completion of the heat treatment, a MR ratio was determined as a MR property for the samples. In order to determine the MR ratio, the magnetic resistance was measured by the DC four-terminal method while applying an external magnetic field up to $4.0 \times 10^5$ A/m in the same direction as an axis of easy magnetization of the pinned magnetic layer. The MR ratio was calculated by the following formula (2), where $R_{max}$ denotes the maximum resistance value obtained from the measurement of the magnetic resistance and $R_{min}$ denotes the minimum resistance value for the same. The MR properties were measured similarly in the following examples also.

$$MR \text{ ratio} = \{(R_{max} - R_{min})/R_{min}\} \times 100 \text{ (\%)} \quad (2)$$

Table 1 shows the composition, the thickness and the thermal expansion coefficient of X in each sample, as well as the results of the heat treatment temperature dependency. The unit of the thermal expansion coefficient is (1/K) (the same applies to the following examples). Note here that, as for sample a03, only $Fe_{0.7}Pt_{0.3}$ (2) out of X corresponds to the low thermal expansion magnetic film and Co (1.5) corresponds to the magnetic film 12 of FIG. 4. In addition, the thermal expansion coefficient for sample a03 represents a value only for the $Fe_{0.7}Pt_{0.3}$ layer as the low thermal expansion magnetic film.

The thermal expansion coefficients of the low thermal expansion magnetic film and the tunnel insulation layer were determined as follows: the thermal expansion amounts of the respective layers were measured by optical interferometry (measured temperature range: 0 to 450° C., temperature rise rate: 1° C./min. and under normal pressure), and the thermal expansion coefficient was determined by the gradient of a tangent line at 25° C. of the graph of the thus measured thermal expansion amounts. The measurement was carried out by fabricating the same low thermal expansion magnetic film and the tunnel insulation layer as in each of the samples on a quartz glass. A thermal expansion coefficient was measured similarly in the following examples also.

Note here that the thermal expansion coefficient of $Al_2O_3$ as the tunnel insulation layer was $8 \times 10^{-6}$/K.

TABLE 1

| | X | | MR ratio after heat treatment at the following temperatures (%) | | | |
|---|---|---|---|---|---|---|
| Sample | Composition (thickness) | Thermal expansion coefficient | 280° C. | 350° C. | 380° C. | 400° C. |
| a01 | Co(2.5) | $13 \times 10^{-6}$ | 27 | 20 | 9 | 1 |
| a02 | $Fe_{0.8}Pt_{0.2}$(3) | $8 \times 10^{-6}$ | 26 | 28 | 27 | 27 |
| a03 | $Fe_{0.7}Pt_{0.3}$(2)/Co(1.5) | $5 \times 10^{-7}$ | 25 | 24 | 25 | 23 |
| a04 | $Fe_{0.75}Pd_{0.25}$(2) | $8 \times 10^{-6}$ | 18 | 20 | 21 | 20 |
| a05 | $Fe_{0.65}Ni_{0.35}$(2.5) | $1 \times 10^{-7}$ | 23 | 25 | 25 | 24 |
| a06 | $Fe_{0.83}B_{0.17}$(2.5) | $3 \times 10^{-7}$ | 15 | 15 | 16 | 15 |
| a07 | $Fe_{0.85}P_{0.15}$(2.5) | $4 \times 10^{-6}$ | 18 | 17 | 17 | 17 |
| a08 | $Fe_{0.5}Pt_{0.5}$(3) | $11 \times 10^{-6}$ | 10 | 5 | 4 | 3 |

As shown in Table 1, as for sample a01 employing as X a soft magnetic material whose thermal expansion coefficient was larger than the thermal expansion coefficient of $Al_2O_3$ by $5 \times 10^{-6}$/K, the MR ratio decreased abruptly in accordance with an increase in the heat treatment temperature, and at the heat treatment temperature of 400° C., the MR ratio could not be obtained substantially. In sample a08 employing the Fe—Pt layer with a thermal expansion coefficient beyond the range of the present invention (having the thermal expansion coefficient larger than the thermal expansion coefficient of $Al_2O_3$ by $3 \times 10^{-6}$/K), the MR ratio after the heat treatment at 280° C. was smaller than those of the other samples and the MR ratio decreased greatly in accordance with an increase in the heat treatment temperature as compared with the other samples a02 to a07.

On the other hand, in samples a02 to a07 employing as X the invar alloys or Fe-base amorphous alloys with thermal expansion coefficients satisfying the above formula (1), the deterioration of the MR ratio was hardly observed even after the heat treatment at 400° C. It can be considered that the low thermal expansion magnetic films such as the invar alloy and the Fe-base amorphous alloy function so as to suppress the stress loading applied to the tunnel insulation layer, thus keeping a stable junction at the interface between the tunnel insulation layer and the adjacent magnetic layer even at high heat treatment temperatures. In addition, although the tunnel insulation layer and the low thermal expansion magnetic film in sample a03 were not in direct contact with each other, the result therefrom shows excellent thermal stability. It can be considered that the Fe—Pd layer as the low thermal expansion magnetic film functions so as to suppress the deterioration of the interface between the Co layer and the tunnel insulation layer.

Example 2

In this example, as for a MR element in which a low thermal expansion magnetic film made of an invar alloy was arranged on either surface of a tunnel insulation layer, the dependency of the MR properties on the heat treatment temperature was evaluated.

By the method similar to Example 1, MR elements with the following film configuration were produced.

Si substrate with a thermal oxide film/Ta (3)/Cu (50)/Ta (3)/Ni—Fe—Cr (4)/Pt—Mn (20)/Co—Fe (3)/Ru (0.8)/Co—Fe (1)/$X_1$/Al$_2$O$_3$ (1)/$X_2$/Ni$_{0.8}$Fe$_{0.2}$ (5)

Ta (3)/Cu (50) on the substrate serves as a lower electrode, and Ta (3)/Ni—Fe—Cr (4) between the lower electrode and the Pt—Mn (20) serves as a buffer layer. The Pt—Mn layer is an antiferromagnetic layer, and the Co—Fe (3)/Ru (0.8)/Co—Fe (1) is a synthetic ferrimagnetic structure, where Ru is a non-magnetic film.

$X_1$ and $X_2$ denote magnetic materials having the compositions shown in the following Table 2. In this example, one type of sample was prepared as a conventional example (sample b01), whereas five types of samples were prepared for this example (samples b02 to b06), which had the element size of 3 μm×4 μm. Note here that the compositions of the Pt—Mn layer, the Ni—Fe—Cr layer and the Co—Fe layer were Pt$_{0.48}$Mn$_{0.52}$, Ni$_{0.6}$Fe$_{0.15}$Cr$_{0.25}$ and Co$_{0.9}$Fe$_{0.1}$, respectively.

Al$_2$O$_3$ functioning as a tunnel insulation layer was produced by depositing an Al film with a thickness of 1.2 nm, followed by plasma oxidation in pure oxygen for 60 seconds. During the production of the respective samples, magnetic anisotropy was assigned to their Pt—Mn layers by performing a vacuum heat treatment (300° C., for 10 hours) in the magnetic field of 4.0×10$^5$ A/m (5 kOe).

The following Table 2 shows the compositions of $X_1$ and $X_2$ and the thicknesses and the thermal expansion coefficients of the same. Note here that, in sample b04, only Fe$_{0.7}$Pd$_{0.3}$ (2) out of $X_2$ corresponds to the low thermal expansion magnetic film and Fe (1) corresponds to the magnetic film 12 of FIG. 4. In addition, the thermal expansion coefficient of $X_2$ in sample b04 represents a value only for the Fe$_{0.7}$Pd$_{0.3}$ layer as the low thermal expansion magnetic film. Similarly, in sample b05, only Fe$_{0.75}$Pt$_{0.25}$ (3) out of $X_1$ and $X_2$ corresponds to the low thermal expansion magnetic film and Co (1) and Co (1.5) correspond to the magnetic film 12 of FIG. 4. The thermal expansion coefficients of $X_1$ and $X_2$ in sample b05 represent a value only for the Fe$_{0.75}$Pt$_{0.25}$ layer as the low thermal expansion magnetic film.

Note here that the thermal expansion coefficient of Al$_2$O$_3$ as the tunnel insulation layer was 8×10$^{-6}$/K.

TABLE 2

| | $X_1$ | | $X_2$ | |
|---|---|---|---|---|
| Sample | Composition (thickness) | Thermal expansion coefficient | Composition (thickness) | Thermal expansion Coefficient |
| b01 | Fe(2) | 12 × 10$^{-6}$ | Fe(1) | 12 × 10$^{-6}$ |
| b02 | Fe$_{0.65}$Ni$_{0.35}$(2) | 1 × 10$^{-6}$ | Fe$_{0.65}$Ni$_{0.35}$(1.5) | 1 × 10$^{-6}$ |
| b03 | Fe$_{0.8}$Pt$_{0.2}$(2.5) | 8 × 10$^{-6}$ | Fe$_{0.65}$Pt$_{0.35}$(2) | 2 × 10$^{-6}$ |
| b04 | Fe$_{0.7}$Pd$_{0.3}$(2) | 1 × 10$^{-7}$ | Fe(1)/Fe$_{0.7}$Pd$_{0.3}$(2) | 1 × 10$^{-7}$ |
| b05 | Fe$_{0.75}$Pt$_{0.25}$(3)/Co(1) | −2 × 10$^{-6}$ | Co(1.5)/Fe$_{0.75}$Pt$_{0.25}$(3) | −2 × 10$^{-6}$ |
| b06 | Fe$_{0.85}$Pt$_{0.15}$(2) | 10 × 10$^{-6}$ | Fe$_{0.85}$Pt$_{0.15}$(2) | 10 × 10$^{-6}$ |

With respect to each of the samples shown in Table 2, the dependency of the MR properties on the heat treatment temperature was evaluated. The heat treatment was carried out by heating the samples up to the respective heat treatment temperatures shown in the following Table 3 in the magnetic field of 4.0×10$^5$ A/m (5 kOe), which was held for 2 hours, followed by cooling down to room temperatures. Thereafter, a MR ratio was determined as the MR property of each sample. The following Table 3 shows the results of the heat treatment temperature dependency of the respective samples.

TABLE 3

| | MR ratio after heat treatment at the following temperatures (%) | | | |
|---|---|---|---|---|
| Sample | 300° C. | 360° C. | 380° C. | 400° C. |
| B01 | 15 | 8 | 2 | 0 |
| B02 | 35 | 35 | 32 | 33 |
| B03 | 24 | 25 | 24 | 24 |
| B04 | 21 | 20 | 19 | 18 |
| B05 | 31 | 28 | 27 | 26 |
| B06 | 40 | 35 | 33 | 33 |

As shown in Table 3, in sample b01 employing as $X_1$ and $X_2$ a soft magnetic material whose thermal expansion coefficient was larger than the thermal expansion coefficient of Al$_2$O$_3$ by 5×10$^{-6}$/K, the MR ratio decreased abruptly in accordance with an increase in the heat treatment temperature, and at the heat treatment temperature of 400° C., the element deteriorated so that the MR ratio could not be obtained at all.

On the other hand, in samples b02 to b06 employing as $X_1$ and $X_2$ the low thermal expansion magnetic films with thermal expansion coefficients satisfying the above formula (1), the MR ratios obtained were larger than those of sample b01 irrespective of the heat treatment temperatures, thus exhibiting excellent thermal stability. In addition, even in the case where the tunnel insulation layer and the low thermal expansion magnetic film are not in direct contact with each other but includes a magnetic film of Fe, Co, etc., with a thermal expansion coefficient larger than that of a tunnel insulation layer interposed therebetween as in samples b04 and b05, although the MR ratio decreased to some extent, excellent thermal stability could be presented. It can be considered that the presence of the low thermal expansion magnetic films such as Fe—Pt and Fe—Pd suppresses an increase in stress loading applied to the tunnel insulation layer in accordance with an increase in the heat treatment temperature, thus suppressing the fluctuation of the interface between the tunnel insulation layer and the adjacent magnetic film.

In addition, in this example, the cross sections of the tunnel insulation layers in samples b01 and b03 subjected to the heat treatment were observed with a transmission electron microscope (TEM). As for the samples after the heat treatment at 280° C., a clear interface was observed between the tunnel insulation layer and the magnetic layer adjacent to the tunnel insulation layer in both of samples b01 and b03, and the thicknesses of the tunnel insulation layers did not change from those before the heat treatment and were uniform as a whole. On the contrary, in sample b01 subjected to the heat treatment at 400° C., a clear interface was not observed between the tunnel insulation layer and the magnetic layer (Fe layer) adjacent to the tunnel insulation layer, and the thickness of the tunnel insulation layer increased unevenly. It can be estimated that this phenomenon is caused by the interfacial diffusion between the tunnel insulation layer and the magnetic layer adjacent to the tunnel insulation layer. On the other hand, in sample b03 subjected to the heat treatment at 400° C., the interface was clear between the tunnel insulation layer and the magnetic layer adjacent to the tunnel insulation layer similarly to after the heat treatment at 280° C., and a change in thickness of the tunnel insulation layer was hardly observed, which exhibited uniformity as a whole.

treatment. After that, a MR ratio was determined as a MR property for the respective samples.

Table 4 shows the composition, the thickness and the thermal expansion coefficient of X in each sample, as well as the results of the heat treatment temperature dependency of the MR ratio.

TABLE 4

| | X | | MR ratio after heat treatment at the following temperatures (%) | | | | |
|---|---|---|---|---|---|---|---|
| Sample | Composition (thickness) | Thermal expansion coefficient | 200° C. | 250° C. | 300° C. | 350° C. | 400° C. |
| c01 | Co(3) | $13 \times 10^{-6}$ | 20 | 23 | 10 | 1 | 0 |
| c02 | $Fe_{0.75}Pt_{0.25}$(3) | $-2 \times 10^{-6}$ | 15 | 25 | 26 | 25 | 24 |
| c03 | $Fe_{0.7}Pd_{0.3}$(3) | $1 \times 10^{-6}$ | 12 | 26 | 25 | 24 | 24 |
| c04 | $Fe_{0.65}Ni_{0.35}$(3) | $1 \times 10^{-6}$ | 18 | 30 | 28 | 28 | 28 |
| c05 | $Fe_{0.63}Co_{0.05}Ni_{0.32}$(3) | $1 \times 10^{-7}$ | 22 | 27 | 26 | 27 | 26 |

Example 3

In this example, as for a MR element in which AlN was used for a tunnel insulation layer, the dependency of the MR properties on the heat treatment temperature was evaluated.

By the method similar to Example 1, MR elements with the following film configuration were produced.

Si substrate with a thermal oxide film/Ta (3)/Cu (50)/Ta (3)/Ni—Fe (4)/X/AlN (1.3)/X/Co (5)/Ir—Mn (8)

Ta (3)/Cu (50) on the substrate serves as a lower electrode, and Ta (3) between the lower electrode and the Ni—Fe layer serves as a buffer layer. The Ir—Mn layer is an antiferromagnetic layer. X denotes magnetic materials having the compositions shown in the following Table 4. In this example, one type of sample was prepared as a conventional example (sample c01), whereas four types of samples were prepared for this example (samples c02 to c05), which had the element size of 2 μm×4 μm. Note here that the compositions of the Ni—Fe layer and the Ir—Mn layer were $Ni_{0.8}Fe_{0.2}$ and $Ir_{0.2}Mn_{0.8}$, respectively.

AlN functioning as a tunnel insulation layer was produced by depositing an Al film with a thickness of 1.3 nm, followed by plasma nitriding in a mixture gas of nitrogen and argon. During the production of the respective samples, magnetic anisotropy was assigned to their Ir—Mn layers by performing a vacuum heat treatment (200° C., for 8 hours) in the magnetic field of $4.0 \times 10^5$ A/m (5 kOe).

Note here that the thermal expansion coefficient of AlN as the tunnel insulation layer was $4 \times 10^{-6}$/K.

With respect to the thus prepared samples, the dependency of the MR properties on the heat treatment temperature was evaluated. Firstly, the samples were heated up to 200° C. in a vacuum and non-magnetic field, which was held for 30 minutes. Thereafter, the samples were cooled down to room temperatures, and the MR ratio was determined as the MR property of each sample. The results were shown in Table 4 as the MR ratio after the heat treatment at 200° C. Next, the samples were heated up to the respective temperatures shown in the following Table 4 in a vacuum and non-magnetic field, and then was held in the magnetic field of $4.0 \times 10^5$ A/m (5 kOe) for 1 hour, followed by cooling down to room temperatures, so as to complete the heat As shown in Table 4, in sample c01 employing as X a soft magnetic material whose thermal expansion coefficient was larger than the thermal expansion coefficient of AlN by $9 \times 10^{-6}$/K, the MR ratio decreased abruptly in accordance with an increase in heat treatment temperature, and at the heat treatment temperature of 400° C., the element deteriorated so that the MR ratio could not be obtained at all.

On the other hand, in samples c02 to c05 employing as X the low thermal expansion magnetic films with thermal expansion coefficients satisfying the above formula (1), the substantially stable MR ratios could be obtained irrespective of the heat treatment temperatures, thus exhibiting excellent thermal stability. In addition, as compared with the case where the heat treatment was performed at 200° C., larger MR ratios could be obtained when heat treatment was performed at much higher temperatures. In this way, also in the case where AlN is used as the tunnel insulation layer, the use of the low thermal expansion magnetic film allows the MR element to exhibit excellent thermal stability.

Example 4

In this example, as for a MR element in which a low thermal expansion magnetic film made of a Fe-base amorphous alloy was arranged on both surfaces of a tunnel insulation layer, the dependency of the MR properties on the heat treatment temperature was evaluated.

By the similar method to Example 1, MR elements with the following film configuration were produced.

Si substrate with a thermal oxide film/Ta (3)/Cu (50)/Ta (3)/Ni—Fe (3)/Pt—Mn (20)/Co—Fe (4)/X/Al₂O₃ (1.2)/X/ $Ni_{0.8}Fe_{0.2}$ (8)

Ta (3)/Cu (50) on the substrate serves as a lower electrode, and Ta (3) between the lower electrode and the Ni—Fe layer serves as a buffer layer. The Pt—Mn layer is an antiferromagnetic layer and has the composition of $Pt_{0.48}Mn_{0.52}$. X denotes magnetic materials having the compositions shown in the following Table 5. In this example, one type of sample was prepared as a conventional example (sample d01), whereas three types of samples were prepared for this example (samples d02 to d04), which had the element size of 2 μm×2.5 μm. Note here that the compositions of the Ni—Fe layer and the Co—Fe layer were $Ni_{0.8}Fe_{0.2}$ and $Co_{0.75}Fe_{0.25}$, respectively.

$Al_2O_3$ functioning as a tunnel insulation layer was produced by forming an Al film with a thickness of 0.3 to 0.7 nm, followed by repeatedly conducted oxidation for 1 minute in an atmosphere containing oxygen at 26.3 kPa (200 Torr). During the production of the respective samples, magnetic anisotropy was assigned to their Pt—Mn layers as the antiferromagnetic layers by performing a vacuum heat treatment (260° C., for 8 hours) in the magnetic field of $4.0 \times 10^5$ A/m (5 kOe).

Note here that the thermal expansion coefficient of $Al_2O_3$ as the tunnel insulation layer was $8 \times 10^{-6}$/K.

With respect to the thus prepared samples, the dependency of the MR properties on the heat treatment temperature was evaluated. The heat treatment was carried out by heating the samples up to the respective heat treatment temperatures shown in Table 5 in a vacuum and non-magnetic field, which was held for 1 hour, followed by cooling down to room temperatures. After that, a MR ratio was determined as a MR property for the respective samples.

Table 5 shows the composition, the thickness and the thermal expansion coefficient of X in each sample, as well as the results of the heat treatment temperature dependency of the MR ratio.

Example 5

The MR elements (sample b01, sample b02 and sample b03) produced in Example 2 were used for producing magnetic heads with shields as shown in FIG. 10, and their properties were evaluated.

When producing the magnetic head, an $Al_2O_3$—TiC substrate was used for a substrate of the magnetic head and a $Ni_{0.8}Fe_{0.2}$ alloy was used for an upper recording core, an upper shield and a lower shield. A lamination film of Cu, Pt and Ta was used as electrodes sandwiching the MR element.

Anisotropy was assigned to the MR elements so that the easy magnetization direction of a magnetic layer functioning as the free magnetic layer was perpendicular to the direction of the signal magnetic field to be detected and the magnetization direction of a magnetic layer functioning as the pinned magnetic layer was parallel to the direction of the signal magnetic field to be detected. Such anisotropy was assigned as follows: after the production of the MR element, firstly, the magnetization direction of the pinned magnetic layer was defined by a heat treatment in a magnetic field (280° C., $4.0 \times 10^5$ A/m (5 kOe)), and then the easy magnetization direction of the free magnetic layer was defined by a heat treatment in a magnetic field (200° C., $8.0 \times 10^5$ A/m

TABLE 5

| | X | | MR ratio after heat treatment at the following temperatures (%) | | | |
|---|---|---|---|---|---|---|
| Sample | Composition (thickness) | Thermal expansion Coefficient | 260° C. | 320° C. | 360° C. | 400° C. |
| d01 | Fe(2) | $12 \times 10^{-6}$ | 18 | 16 | 7 | 1 |
| d02 | $Fe_{0.83}B_{0.17}(2.5)$ | $3 \times 10^{-7}$ | 21 | 20 | 19 | 18 |
| d03 | $Fe_{0.85}P_{0.15}(2)$ | $4 \times 10^{-6}$ | 26 | 24 | 24 | 23 |
| d04 | $Fe_{0.75}Hf_{0.25}(2.5)$ | $4 \times 10^{-6}$ | 18 | 18 | 17 | 16 |

As shown in Table 5, in sample d01 employing as X a soft magnetic material whose thermal expansion coefficient was larger than the thermal expansion coefficient of $Al_2O_3$ by $4 \times 10^{-6}$/K, the MR ratio decreased abruptly in accordance with an increase in the heat treatment temperature, and at the heat treatment temperature of 400° C., the MR ratio could not be obtained substantially. On the other hand, it was confirmed that samples d02 to d04 employing the Fe-base amorphous alloys with thermal expansion coefficients satisfying the above formula (1) were MR elements with excellent thermal stability.

Note here that, in the above-stated Examples 1 to 4, also in the case where alloys having compositions represented by the formula $Fe_x$—$Ni_y$—$Co_z$ (where $x+y+z=1$, $0.5 \leq x \leq 0.7$, $0.3 \leq y \leq 0.45$, $0 \leq z \leq 0.2$), alloys having compositions represented by the formula $Fe_{1-a}$—$Pt_a$ (where $0.15 \leq a \leq 0.45$) and alloys represented by the formula $Fe_{1-b}$—$Pd_b$ (where $0.2 \leq b \leq 0.45$) were used as X (or as $X_1$ and $X_2$), MR elements with excellent thermal stability could be obtained. Note here that the thermal expansion coefficients of these alloys satisfied the above-stated formula (1).

Similarly, also in the case where magnetic materials having compositions represented by the formula $Fe_{1-c}$—$M_c$ ($0.05 \leq c \leq 0.3$, M denotes at least one element selected from the group consisting of B, P, Si, Zr and Hf) were used as X (or as $X_1$ and $X_2$), MR elements with excellent thermal stability could be obtained. Note here that the thermal expansion coefficients of these magnetic materials satisfied the above-stated formula (1).

(10 kOe)). Note here that the size of the MR elements was 0.5 μm×0.5 μm.

The thus produced magnetic heads were subjected to a test where the magnetic heads were placed in a constant temperature bath at 150° C. and were allowed to stand for 10 days while applying a voltage of 500 mV to the MR elements. Between prior to and subsequent to the tests, the MR outputs were compared. The MR outputs were measured by the following methods:

The magnetic head was placed in a Helmholtz coil, and while current was applied to the MR element, the magnetic resistance obtained was measured by the DC four-terminal method. When the magnetic resistance was measured, the measurement magnetic field was changed within a range of $\pm 4.0 \times 10^4$ A/m. A difference between the maximum value and the minimum value of the thus obtained magnetic resistance was set as the MR output of the magnetic head. Note here that the direction of the measurement magnetic field generated by the Helmholtz coil was set as the easy magnetization direction of the pinned magnetic layer of the MR element.

As a result of the evaluation, in the magnetic head employing the sample b01 as the MR element, extremely large deterioration of the output (about 45%) was generated between prior to and subsequent to the test. On the other hand, in the magnetic heads employing sample b02 and sample b03 as the MR elements, the deterioration of the output was within about 2% between prior to and subsequent to the test, thus exhibiting very stable output properties even after the test.

Example 6

The MR elements (sample a01 and sample a03) produced in Example 1 and the MR elements (sample b03 and sample b05) produced in Example 2 were used for producing magnetic heads with a yoke as shown in FIGS. 11 and 12.

When producing the magnetic head, a Mn—Zn ferrite substrate was used for a substrate, which doubled as a lower yoke. An insulation layer on the substrate was formed using $Al_2O_3$, on which the MR element was produced. A CoZrTa soft magnetic material was used as an upper yoke and $Al_2O_3$ was used as an insulation layer portion. In addition, a CoPt alloy was used as a hard bias portion, and a lamination film of Cu, Ta and Pt was used as a lead portion. As for the shape of the MR elements, the MR height 539 shown in FIG. 11 and the MR width 540 shown in FIG. 12 were both 8 $\mu$m.

Similarly to Example 5, anisotropy was assigned to the MR elements so that the easy magnetization direction of a magnetic layer functioning as the free magnetic layer was perpendicular to the direction of the signal magnetic field to be detected and the magnetization direction of a magnetic layer functioning as the pinned magnetic layer was parallel to the direction of the signal magnetic field to be detected. Note here that a read gap length of the magnetic heads was set at 0.1 $\mu$m.

The thus produced magnetic heads were subjected to a test where the magnetic heads were placed in a constant temperature bath at 160° C. and were allowed to stand for 50 days while applying a voltage of 200 mV to the MR elements. Between prior to and subsequent to the tests, the MR outputs were compared. The MR outputs were measured by the same method as in Example 5.

As a result of the evaluation, in the magnetic head employing the sample a01 as the MR element, extremely large deterioration of the output (about 50%) was generated between prior to and subsequent to the test. On the other hand, in the magnetic heads employing sample a03, sample b03 and sample b05 as the MR elements, the deterioration of the output was within about 1% between prior to and subsequent to the test, thus exhibiting very stable output properties even after the test.

Example 7

The MR elements (sample a01 and sample a02) produced in Example 1 were used to produce a magnetic memory (MRAM) as shown in FIG. 17.

The MRAM was produced as follows: firstly, word lines made of Cu were formed on a Si substrate with a thermal oxide film of 300 nm, on the surface of which an $Al_2O_3$ insulation film was formed, and a lower electrode made of Cu was formed. Then, the surface of the lower electrode was planarized by CMP, followed by the lamination of the MR element having the film configuration shown in sample a01 or a02.

Next, a heat treatment in a magnetic field at 280° C. and 4.0×10⁵ A/m (5 kOe) was performed for 5 hours so that exchange coupling magnetic field occurred during the Pt—Mn layer as the antiferromagnetic layer and the pinned magnetic layer. Thereafter, similarly to Example 1, microprocessing was carried out into a mesa shape so as to form the MR element. Finally, bit lines were formed as an upper electrode, so as to produce a single magnetic memory without switching elements as shown in FIG. 17.

Current was applied to the word lines and the bit lines of the thus produced magnetic memory so as to generate magnetic field, so that the magnetic orientation of the free magnetic layer of the MR element (Ni—Fe (5) in both samples in this example) was reversed to record information "0". Next, the current in the reverse direction was applied to the word lines and the bit lines so as to generate magnetic field, so that the magnetic orientation of the free magnetic layer was reversed to record information "1". Subsequently, a sense current was applied to the MR elements in the respective states by applying bias voltage so as to measure a difference in the voltage of the element between the state of information "0" and the state of information "1". As a result, both of the samples showed the difference in output at the same level. Therefore, it was confirmed that both of the samples functioned as a magnetic memory where their free magnetic layers served as information recording layers.

Next, the above-stated MR elements were placed on a CMOS substrate so as to produce an integrated magnetic memory as shown in FIG. 14. The elements were arranged so as to constitute 8 blocks where 1 block is made up of 16×16 elements. The MR elements were arranged as follows: firstly, FETs functioning as switching elements were arranged on a CMOS substrate in a matrix form, followed by the planarization of the surface by CMP, and the MR elements of sample a02 or sample a01 were arranged in a matrix form so as to correspond to the FETs. After the arrangement of the MR elements, a hydrogen sintering treatment was carried out at 400° C. Note here that one element in each block was made a dummy element for canceling the wiring resistance, the minimum resistance of the elements and the FET resistance. The word lines and the bit lines were all made of Cu and the size of the elements was each 0.1 $\mu$m×0.15 $\mu$m.

With respect to the thus produced magnetic memory, signals were recorded by reversing the magnetization of the free magnetic layers of the eight elements concurrently in each block with the combined magnetic field generated by the word lines and the bit lines. Next, a gate of the FETs was turned ON one element at a time for each block, so as to allow sense current to flow through the element. At this time, the voltages generated across the bit line, the element and the FET in each block were compared with a dummy voltage by a comparator, so as to read the output of the respective elements.

As a result of the measurement, no output was obtained from the MRAM using sample a01 as the MR elements. On the other hand, in the MRAM using sample a02 as the MR elements, favorable outputs could be obtained from the element similarly to the single magnetic memory as stated above. From this result, it can be considered that sample a01 could not withstand the heat treatment at 400° C. due to the reason as stated in Example 1, whereas sample a02 could have sufficient thermal stability against the heat treatment at 400° C.

As stated above, according to the present invention, a magnetoresistive element with excellent thermal stability can be obtained. In addition, the use of the magnetoresistive element of the present invention can realize a magnetic head, a magnetic memory element and a magnetic recording apparatus with excellent thermal stability.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A magnetoresistive element comprising a multilayer film configuration comprising: a tunnel insulation layer; and a pair of magnetic layers that are laminated with the tunnel insulation layer interposed therebetween, wherein a resistance value of the magnetoresistive element varies with a relative angle between magnetic orientations of both of the magnetic layers, and at least one of the magnetic layers comprises a magnetic film having a thermal expansion coefficient not greater than a value obtained by adding $2\times10^{-6}$/K to a thermal expansion coefficient of the tunnel insulation layer.

2. The magnetoresistive element according to claim 1, wherein the thermal expansion coefficient of the magnetic film is not greater than the thermal expansion coefficient of the tunnel insulation layer.

3. The magnetoresistive element according to claim 1, wherein the magnetic film is in contact with the tunnel insulation layer.

4. The magnetoresistive element according to claim 1, wherein the tunnel insulation layer comprises at least one compound selected from the group consisting of an oxide, a nitride and an oxynitride of Al.

5. The magnetoresistive element according to claim 1, wherein the magnetic film comprises an invar alloy.

6. The magnetoresistive element according to claim 5, wherein the invar alloy has a composition represented by the formula $Fe_x$—$Ni_y$—$Co_z$, where, in the formula $Fe_x$—$Ni_y$—$Co_z$, x, y and z are numbers satisfying the following relationships:

$$x+y+z=1,$$

$$0.5 \leq x \leq 0.7,$$

$$0.3 \leq y \leq 0.45, \text{ and}$$

$$0 \leq z \leq 0.2.$$

7. The magnetoresistive element according to claim 5, wherein the invar alloy has a composition represented by the formula $Fe_{1-a}$—$Pt_a$, where, in the formula $Fe_{1-a}$—$Pt_a$ a is a number satisfying the following relationship:

$$0.15 \leq a \leq 0.45.$$

8. The magnetoresistive element according to claim 5, wherein the invar alloy has a composition represented by the formula $Fe_{1-b}$—$Pd_b$, where, in the formula $Fe_{1-b}$—$Pd_b$, b is a number satisfying the following relationship:

$$0.2 \leq b \leq 0.45.$$

9. The magnetoresistive element according to claim 1, wherein the magnetic film comprises an amorphous alloy containing Fe as a main component.

10. The magnetoresistive element according to claim 6, wherein the amorphous alloy has a composition represented by the formula $Fe_{1-c}$—$M_c$, where, in the formula $Fe_{1-c}$—$M_c$, M denotes at least one element selected from the group consisting of B, P, Si, Zr and Hf, and c is a number satisfying the following relationship:

$$0.05 \leq c \leq 0.3.$$

11. The magnetoresistive element according to claim 1, further comprising an antiferromagnetic layer.

12. The magnetoresistive element according to claim 11, wherein the antiferromagnetic layer comprises Mn.

13. A magnetic head, comprising:

the magnetoresistive element according to claim 1; and a shield for restricting introduction of a magnetic field other than a magnetic field to be detected by the magnetoresistive element into the magnetoresistive element.

14. A magnetic recording apparatus, comprising:

the magnetic head according to claim 13; and a magnetic recording medium from which magnetic information can be read out by the magnetic head.

15. A magnetic head, comprising:

the magnetoresistive element according to claim 1; and a yoke for introducing a magnetic field to be detected by the magnetoresistive element to the magnetoresistive element.

16. A magnetic recording apparatus, comprising:

the magnetic head according to claim 14; and a magnetic recording medium from which magnetic information can be read out by the magnetic head.

17. A magnetic memory, comprising:

the magnetoresistive element according to claim 1;

conductive lines for recording information on the magnetoresistive element; and conductive lines for reading out the information.

* * * * *

UNITED STATES PATENT AND TRADEMARK OFFICE
CERTIFICATE OF CORRECTION

PATENT NO. : 6,842,317 B2
DATED : January 11, 2005
INVENTOR(S) : Sugita et al.

It is certified that error appears in the above-identified patent and that said Letters Patent is hereby corrected as shown below:

Column 25,
Line 42, "$Fe_{1-a}$–$Pt_a$ a is a number" should read -- $Fe_{1-a}$ –$Pt_a$, a is a number --.

Column 26,
Line 8, "according to claim 6" should read -- according to claim 9 --.
Line 10, "by the formula $Fe_{1-c-Mc}$," should read -- by the formula $Fe_{1-c}$-$M_c$ --.

Signed and Sealed this

Tenth Day of January, 2006

JON W. DUDAS
*Director of the United States Patent and Trademark Office*